(12) United States Patent
Kim et al.

(10) Patent No.: US 8,045,261 B2
(45) Date of Patent: Oct. 25, 2011

(54) REFLECTIVE SEMICONDUCTOR OPTICAL AMPLIFIER (RSOA), RSOA MODULE HAVING THE SAME, AND PASSIVE OPTICAL NETWORK USING THE SAME

(75) Inventors: Byoung Whi Kim, Daejeon (KR); Mahn Yong Park, Gwangju (KR); Woo-Ram Lee, Daejeon (KR); Tae Yeon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/773,174

(22) Filed: May 4, 2010

(65) Prior Publication Data
US 2010/0209108 A1    Aug. 19, 2010

Related U.S. Application Data

(62) Division of application No. 11/633,349, filed on Dec. 4, 2006, now Pat. No. 7,738,167.

(30) Foreign Application Priority Data

Dec. 9, 2005  (KR) .................. 10-2005-0121025
May 30, 2006  (KR) .................. 10-2006-0049022

(51) Int. Cl.
*H01S 3/00* (2006.01)

(52) U.S. Cl. .................. 359/344; 398/72; 398/99
(58) Field of Classification Search .......... 398/72, 398/99; 359/344
See application file for complete search history.

(56) References Cited

U.S. PATENT DOCUMENTS

2003/0142978 A1 * 7/2003 Lee et al. .................. 398/34
* cited by examiner

*Primary Examiner* — Mark Hellner
(74) *Attorney, Agent, or Firm* — Ladas & Parry LLP

(57) ABSTRACT

A Reflective Semiconductor Optical Amplifier (RSOA) for compensating for light loss in an optical link, an RSOA module for improving polarization dependency using the RSOA, and a Passive Optical Network (PON) for increasing economical efficiency and practical use of a bandwidth using the RSOA are provided. The PON includes a central office comprising a plurality of optic sources transmitting a downstream signal and a plurality of first receivers receiving an upstream signal; at least one optical network terminal (ONT) including a second receiver receiving the downstream signal and an RSOA which receives the downstream signal, remodulates the downstream signal into the upstream signal, and transmits the upstream signal in loopback mode; and a remote node interfacing the central office with the ONT. The upstream signal and the downstream signal are transmitted between the remote node and the ONT via a single optical fiber. The remote node includes an optical power splitter at its port connected to the ONT.

19 Claims, 16 Drawing Sheets

REFLECTIVE SEMICONDUCTOR OPTICAL AMPLIFIER (RSOA), RSOA MODULE HAVING THE SAME, AND PASSIVE OPTICAL NETWORK USING THE SAME

CROSS-REFERENCE TO RELATED PATENT APPLICATIONS

This application claims the benefit of Korean Patent Application Nos. 10-2005-0121025, filed on Dec. 9, 2005 and 10-2006-49022, filed on May 30, 2006, in the Korean Intellectual Property Office, the disclosures of which are incorporated herein in their entirety by reference.

BACKGROUND OF THE INVENTION

1. Field of the Invention

The present invention relates to a Passive Optical Network (PON), and more particularly, to a Reflective Semiconductor Optical Amplifier (RSOA), an RSOA module having the RSOA, and a PON using the RSOA.

2. Description of the Related Art

Fiber To The Home (FTTH) technology for directly connecting a telephone switch to a home through optical fiber has been actively researched and developed worldwide in order to provide voice, data, and broadcast convergence services to subscribers and is expected to become popular within a few years. From the point of view of the characteristics of an optical network, it is most important to develop an optical signal transmission method having superior economical efficiency and mass productivity in developing the FTTH technology. Optical networks may be classified into a Passive Optical Network (PON) and an Active Optical Network (AON). The PON is currently being developed in the forms of an Asymmetric Transfer Mode (ATM)-PON, a B-PON, a G-PON and an E-PON. The AON is being developed into a form that connects local networks, each of which is composed of Ethernet switches, using optical fiber.

A Wavelength Division Multiplexing (WDM)-based FTTH network, that is, a WDM-PON, is a scheme in which the communication between a center office (CO) and subscribers is performed using a wavelength assigned to each subscriber. Such a WDM-PON is advantageous in that the WDM-PON can provide independent and high-capacity communication service to each subscriber, and has excellent security. Furthermore, in the WDM-PON, the modulation and demodulation of light are performed for each subscriber, unlike a Time Division Multiplexing (TDM) type, so that an optic source having low modulation speed and output and a receiver having narrow bandwidth can be employed.

However, since intrinsic wavelengths are respectively assigned to subscribers for communication with the CO, the WDM-PON has a limited wavelength band and interval, and thus, the number of subscribers is also limited. Moreover, although a transmission speed per wavelength is at least 1 Gbps, there is no content to be transmitted for which this high speed is appropriate.

From an economical point of view, the WDM-PON is more expensive since it requires a pair of optical transceiver modules for each subscriber, which are respectively installed in a subscriber's area and the CO. In addition, the WDM-PON requires optic sources having intrinsic wavelengths, the number of which is identical to the number of subscribers, so that an economical burden is imposed on subscribers and, therefore, implementation of the WDM-PON is difficult. From a maintenance point of view, the service provider is disadvantaged in that it must prepare different optic sources having different wavelengths for individual subscribers for installation and breakdowns. Accordingly, it is important to develop a low cost WDM-PON optic source and the provision of the same kind of wavelength-independent optic sources to all subscribers is necessarily required to implement the WDM-PON.

Meanwhile, a method of forming a WDM-PON that uses a Reflective Semiconductor Optical Amplifier (RSOA) and thus does not need independent seed light for an upstream signal (hereinafter referred to as a "seedless RSOA-based WDM-PON") and its applications have been suggested. In the operation of the seedless RSOA-based WDM-PON, an optical signal modulated into a downstream data output from the CO (hereinafter, referred to as a "downstream signal") is input to an RSOA at an optical network terminal (ONT) and the RSOA is operated in a gain-saturation region with respect to input optical signal power so that a difference between levels (i.e., level 0 and level 1) of the input optical signal is remarkably squeezed and the optical signal is remodulated into upstream data (hereinafter, referred to as an "upstream signal) and is transmitted to the CO.

In an RSOA structure, a usual SOA chip has a backside with a high-reflective (HR) coating facet and a front side with an anti-reflective (AR) coating facet. Light incident onto the front side is amplified while progressing in an active waveguide, is then reflected from the HR coating facet on the backside, and is then output through the front side. The RSOA structure may be classified into a weakly-index guided structure and a strongly-index guided structure according to the structure of a waveguide in the active region. The weakly-index guided structures include many kinds of waveguide structures, but a ridge waveguide structure is a typical structure. The strongly-index guided structure includes a planar buried heterostructure and a stripe buried heterostructure.

FIGS. 1A and 1B are horizontal and vertical cross-sections of a conventional RSOA 10 into which a passive spot-size converter is integrated. Referring to FIG. 1A, the RSOA 10 includes an active region 11, a p-type electrode 13 supplying current to the active region 11, and a passive spot-size converter 12. An HR coating facet 14a and an AR coating facet 14b are formed on both ends, respectively, of the RSOA 10. The AR coating facet 14b is an exit surface 14c for output light.

The passive spot-size converter 12 is formed using a material different from that of the active region 11 and is connected with the active region 11 using a butt-joint method. The passive spot-size converter 12 is inclined at a predetermined angle of θ with respect to a normal A of the exit surface 14c in order to improve an AR property. The predetermined angle of θ is in a range of 0 through 10 degrees.

Referring to FIG. 1B, an n-type electrode 15 is formed at the bottom of the RSOA 10. Accordingly, the current supplied by the p-type electrode 13 flows across the active region 11 to generate light and then flows into the n-type electrode 15.

The passive spot-size converter 12 increases the size of an optical mode generated to an appropriate range, thereby increasing the optical coupling efficiency between the RSOA 10 and optical fiber or other waveguides. A method of gradually decreasing an initial width $W_{active}$ of the active region 11 to an end width $W_{taper}$ of the passive spot-size converter 12, a method of gradually decreasing an initial thickness $H_{active}$ of the active region 11 to an end thickness $H_{taper}$ of the passive spot-size converter 12, or a combination of them may be used to increase the size of the optical mode. Usually, the initial width $W_{active}$ is 0.8-1.5 µm; the initial thickness $H_{active}$ is 0.1-0.4 µm; the end width $W_{taper}$ is 0.1-0.5 µm; and the end thickness $H_{taper}$ is 0.01-0.05 µm.

The performance of the passive spot-size converter 12 is usually evaluated based on a far-field angle. It is preferable that the far-field angle be 25 degrees or less in both of vertical and horizontal directions in order to increase the optical coupling efficiency between the passive spot-size converter 12 and optical fiber or other waveguides.

A length $L_{chip}$ of the RSOA 10 may be 600-1500 μm but may be 1000 μm or less in order to realize a cheap TO-package. The active region 11 of the RSOA 10 may have a length $L_{active}$ of 200-600 μm.

FIG. 2 is a cross-section of the RSOA 10, taken along line I-I illustrated in FIG. 1A, and particularly, is a cross-section of the RSOA 10 having a planar buried heterostructure. Referring to FIG. 2, the RSOA 10 includes the active region 11 on an n-type substrate 16, a clad 18 including a lower clad 18a and an upper clad 18b respectively disposed below and above the active region 11, and the p-type electrode 13 and the n-type electrode 15 for supplying current to the active region 11. A planar buried heterostructure 11a is disposed on the top and bottom surfaces of the active region 11. The active region 11 and the planar buried heterostructure 11a form a waveguide. In addition, a current blocking layer 17 having a two-layer structure with a p-doped layer and an n-doped layer is disposed on the left and right sides of the active region 11 so that current from the p-type electrode 13 is supplied only to the active region 11.

Meanwhile, an ohmic contact layer 19a is disposed between the upper clad 18b and the p-type electrode 13, whereby an ohmic resistance between the upper clad 18b and the p-type electrode 13 is reduced. A passivation layer 19b may be disposed on a top surface of the ohmic contact layer 19a.

FIGS. 3A and 3B are horizontal and vertical cross-sections of an RSOA 10a into which a conventional active spot-size converter 12a is integrated. The RSOA 10a including the active spot-size converter 12a is almost the same as the RSOA 10 including the passive spot-size converter 12, with the exception of the form of an electrode and used materials. In detail, the active spot-size converter 12a is formed using the same material as the active region 11. Accordingly, the active spot-size converter 12a is formed by slanting the material of the active region 11 at an angle of θ with respect to a normal of the exit surface 14c without a butt-joint. Meanwhile, a p-type electrode 13a is formed for the active spot-size converter 12a. Other elements like the shape, the size and the far-field angle of the active spot-size converter 12a are the same as those of the passive spot-size converter 12.

The RSOA structure may be classified into a multiple quantum well structure and a bulk structure. Usually, an active region in an RSOA has an indium gallium arsenide phosphide (InGaAsP) bulk structure because it is not easy to reduce polarization-dependent gain (PDG) by controlling stress at a quantum well region in the multiple quantum well structure.

However, when the active region has the bulk structure, gain and saturation performance rapidly decreases when the temperature of the RSOA increases. Accordingly, a special temperature stabilizer is needed to use the bulk structure in a temperature range of 0-40 degrees or −20-60 degrees where communication systems are usually used. For this reason, the price of RSOA modules increases and the reliability thereof decreases. The active region may have the multiple quantum well structure to avoid these problems. However, as described above, when the multiple quantum well structure is used, it is necessary to precisely control polarization of light input to an RSOA by an optical link or to use unpolarized light due to a PDG problem.

Briefly, the multiple quantum well structure has excellent gain, saturation and temperature characteristics but has a PDG problem, while the bulk structure can reduce PDG when a tensile stress is appropriately applied during the growth of an active region but has poor gain, saturation and temperature characteristics.

Conventional methods of manufacturing an optical transceiver module or RSOA module using the above-described RSOA may be largely classified into an active alignment method and a passive alignment method. The RSOA installed within a TO-package or TO-CAN is aligned with optical fiber using the active alignment method and then fixed and packaged using laser welding. When the passive alignment method is used, the RSOA is aligned with an optical axis of a waveguide on a planar lightwave circuit (PLC) platform, aligned with optical fiber using a V-groove formed in the PLC platform, and fixed and packaged using an ultraviolet-curable or thermosetting epoxy. The passive alignment method enables easier alignment than the active alignment method, thereby being suitable for mass production, but is disadvantageous in that it needs expensive flip-chip bonding equipment and precise fabrication of a V-groove.

SUMMARY OF THE INVENTION

The present invention provides a Reflective Semiconductor Optical Amplifier (RSOA) for compensating for light loss in an optical link.

The present invention also provides an RSOA module using the RSOA, for improving polarization dependency.

The present invention also provides a Passive Optical Network (PON) using the RSOA, for increasing economical efficiency and practical use of a bandwidth.

According to an aspect of the present invention, there is provided an RSOA including an active region performing amplification, a p-type electrode supplying current to the active region, an anti-reflective coating facet through which a signal input and output, and a high-reflective coating facet reflecting a signal. The anti-reflective coating facet and the high-reflective coating facet are formed at both ends, respectively, of the RSOA. The p-type electrode is divided into a first portion and a second portion with a predetermined gap between the two portions.

The active region may have a multiple quantum well structure or a bulk structure and may have a width of 0.8-1.5 μm and a thickness of 0.1-0.4 μm.

The active region may include at least one material among indium gallium arsenide phosphide (InGaAsP), indium aluminum arsenide (InAlAs), aluminum arsenide phosphide (AlAsP), indium gallium aluminum arsenide (InGaAlAs), indium aluminum arsenide phosphide (InAlAsP), and indium gallium nitride arsenide (InGaNAs).

A direct current for squeezing a signal may be supplied to the first portion of the p-type electrode, and a bias current and a radio frequency current for amplifying and remodulating a signal may be supplied to the second portion of the p-type electrode.

The RSOA may further include a spot-size converter. The spot-size converter may be of a passive type coupled with the active region through a butt-joint or of an active type formed using the same material as the active region.

When the spot-size converter is of a passive type, the p-type electrode may be formed in a portion excluding the spot-size converter. When the spot-size converter is of an active type, the p-type electrode may be formed throughout the RSOA, and the gap may be positioned above the spot-size converter.

The spot-size converter may have a far-field angle of 25 degrees or less in a vertical direction and a horizontal direction and may maintain a predetermined angle with respect to a normal of the anti-reflective coating facet.

According to another aspect of the present invention, there is provided a RSOA module including an RSOA which includes an active region having a multiple quantum well structure, the RSOA being installed in a planar lightwave circuit (PLC) platform using a flip-chip method, the PLC platform including a directional coupler.

The directional coupler may be a polarization directional coupler formed by coupling a signal transmission waveguide with at least one polarization waveguide. The polarization waveguide may have a ring shape. A waveplate may be formed at a portion of the polarization waveguide where the coupling is performed or at the other portion.

The waveplate may be a thin film having a thickness of 50 µm or less and have a phase delay of $\lambda/4$, $\lambda/2$, or $3\lambda/4$.

The directional coupler may be a 2×2 directional coupler formed by coupling two signal transmission waveguides with each other. Both ends of one of the two signal transmission waveguides may be optically respectively connected to a data photodiode and a monitoring photodiode, and both ends of the other of the two signal transmission waveguide may be optically respectively connected to the RSOA and an input optical fiber, whereby the RSOA module may have a bidirectional module structure.

The RSOA module may further include a polarization directional coupler formed by coupling the signal transmission waveguide with at least one polarization waveguide, positioned between the 2×2 directional coupler and the RSOA.

A waveguide in the PLC platform may have a channel structure, a rib structure, a ridge structure, or a slab structure and may be formed using at least one material among silica, polymer, silicon, silicon nitride (SIN), and silicon oxide nitride (SiON). The PLC platform may further include a V-groove for passive alignment with an optical fiber.

According to still another aspect of the present invention, there is provided a PON using an RSOA. The PON includes a central office including a plurality of optic sources transmitting a downstream signal and a plurality of first receivers receiving an upstream signal; at least one optical network terminal (ONT) including a second receiver receiving the downstream signal and an RSOA which receives the downstream signal, remodulates the downstream signal into the upstream signal, and transmits the upstream signal in loopback mode; and a remote node interfacing the central office with the ONT. The upstream signal and the downstream signal are transmitted between the remote node and the ONT via a single optical fiber.

Input/output ports of the second receiver and the RSOA may be combined through a coupler. The upstream signal and the downstream signal may be transmitted via different optical fibers, respectively, or a single optical fiber between the central office and the remote node.

When the upstream signal and the downstream signal are transmitted via two different optical fibers, respectively, between the central office and the remote node, the remote node may include an optical multiplexer/demultiplexer and a circulator. Alternatively, when the upstream signal and the downstream signal are transmitted between the central office and the remote node via a single optical fiber, the remote node may include an optical multiplexer/demultiplexer and the central office may include a circulator, an optical multiplexer, and an optical demultiplexer.

The remote node may further include an optical power splitter installed at a port of the optical multiplexer/demultiplexer to be connected to the ONT. The optical power splitter may have a split ratio of 1:M and accommodate M ONTs. In addition, the optical power splitter may be a time division multiplexing (TDM) splitter, the second receiver may extract a signal from a time slot assigned thereto, and the RSOA may insert a signal into a time slot assigned thereto.

When the remote node includes the optical power splitter, the first receiver may be a burst mode receiver. The central office may further include an optical amplifier connected to an output end of an optical multiplexer connected to output ends of the respective optic sources. The optical amplifier may be an erbium-doped fiber amplifier (EDFA).

The RSOA may include a p-type electrode divided into two portions with a predetermined gap interposed therebetween to supply current and an active region having a multiple quantum well structure or a bulk structure. The RSOA may further include a spot-size converter which is a passive type coupled with the active region through butt-joint or an active type formed using the same material as the active region. The RSOA may be installed in a planar lightwave circuit (PLC) platform using a flip-chip method or may be optically connected to an optical fiber through active alignment to be installed in a TO-CAN.

The RSOA includes the p-type electrode which is divided into the two portions, thereby reducing light loss due to an optical link. The RSOA module using the RSOA includes the waveplate inserted into the PLC platform, thereby improving polarization dependency. The PON uses a common optical fiber for the transmission of the upstream signal and the downstream signal between the remote node and the ONT and between the central office and the remote node and includes a TDM splitter in the remote node, thereby increasing the economical efficiency and practical use of a bandwidth.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
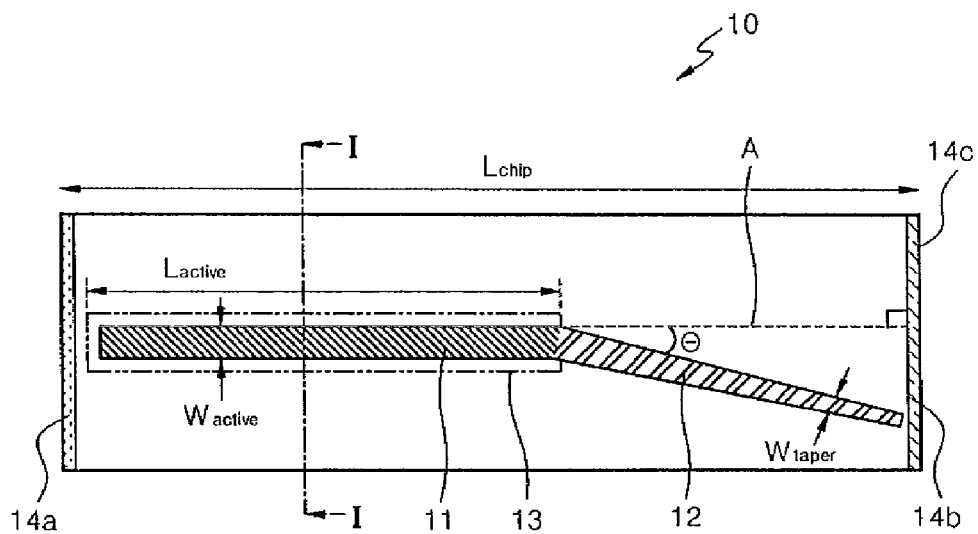
FIGS. 1A and 1B are horizontal and vertical cross-sections of a conventional Reflective Semiconductor Optical Amplifier (RSOA) into which a passive spot-size converter is integrated.

The present invention will now be described more fully with reference to the accompanying drawings, in which exemplary embodiments of the invention are shown. It will be understood that when a layer is referred to as being "on" another layer or substrate, it can be directly on the other layer or substrate, or intervening layers may also be present. In the drawings, the thicknesses and sizes of layers are exaggerated for clarity and irrelevant parts are omitted. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements.

Conventional Wavelength Division Multiplexing Passive Optical Network (WDM-PON) systems have disadvantages such as restriction of wavelength range and interval, restriction of the number of subscribers, lack of contents that can utilize a transmission speed of at least 1 Gbps, and high cost. To solve these problems, the present invention uses Time Division Multiplexing (TDM) in a WDM-PON to allow a plurality of subscribers to use a single wavelength in different time slots so that the plurality of subscribers can share a bandwidth.

When TDM is used, a plurality of subscribers can share equipment in a base station, whereby the cost for equipment can be reduced. In addition, since the number of subscribers that can be assigned to an optical fiber can be remarkably increased, cost for an outside plant (OSP) can be reduced. Moreover, a band of 1 Gbps per wavelength is shared by a plurality of subscribers so that a bandwidth can be used efficiently. Ethernet-PON (EPON) technology, a representative TDM network, has been developed to provide services to subscribers. Hereinafter, a hybrid PON combining a WDM-PON and an EPON is referred to as a WE-PON.

In such a WE-PON, since a plurality of subscribers share a wavelength, optical loss occurs inevitably. Optical loss in a WE-PON optical link is directly related with the number of subscribers sharing a wavelength. It is necessary to increase the number of subscribers or branches sharing a wavelength in order to decrease the entire cost for a WE-PON system, but this increase also causes the optical loss to increase. Accordingly, the improvement of performance of an optical network terminal (ONT) optic source is required. Consequently, as an ONT optic source for accommodating a plurality of subscribers per wavelength, a Reflective Semiconductor Optical Amplifier (RSOA) needs to have characteristics such as a high gain, a low gain saturation input power level, low polarization dependency, and an uncooled operation.

In detail, to decrease the power penalty and increase the transmission performance in downstream transmission, an RSOA should be designed to operate in a gain-saturation region. In other words, the RSOA should be designed so that a gain is saturated even at a low RSOA input optical power. In addition, optical loss in an optical link should be compensated for with the gain of the RSOA so that optical power greater than the receive sensitivity of a receiver in a central office can be transmitted. Moreover, a gain and saturation property should be the same with respect to polarized light since the polarized light input to the RSOA is unpredictable. Uncooled operation is preferable since upstream/downstream transmission should be possible within a variable temperature range of an optical fiber transmission line.

Hereinafter, exemplary embodiments of an RSOA that can operate in a gain-saturation region and an RSOA module and a PON using the RSOA will be described.

<<Embodiments of an RSOA>>

Figure 1B:
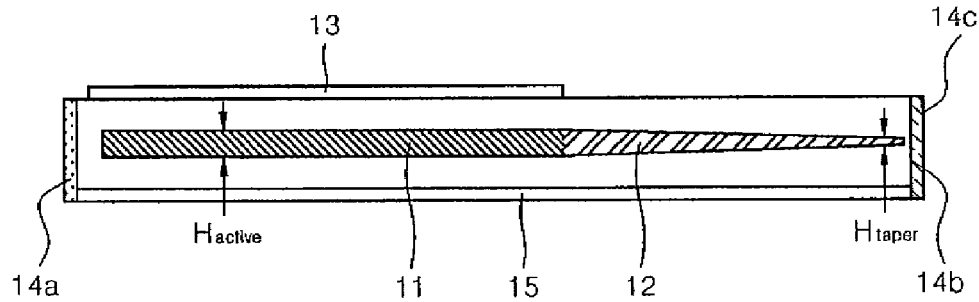
Figure 2:
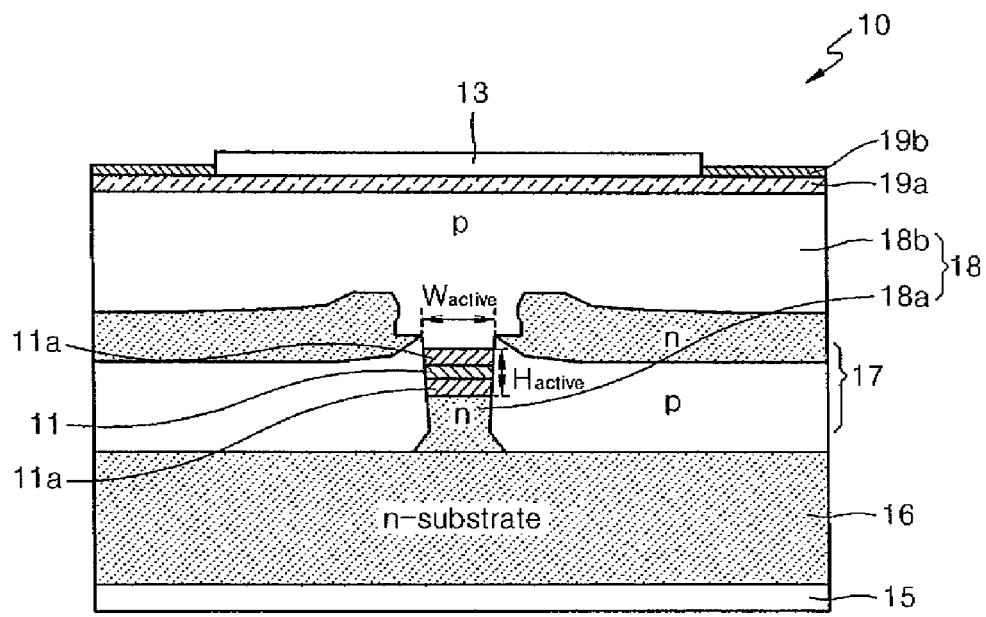
FIG. 2 is a cross-section of the RSOA, taken along line I-I illustrated in FIG. 1A.
Figure 4:
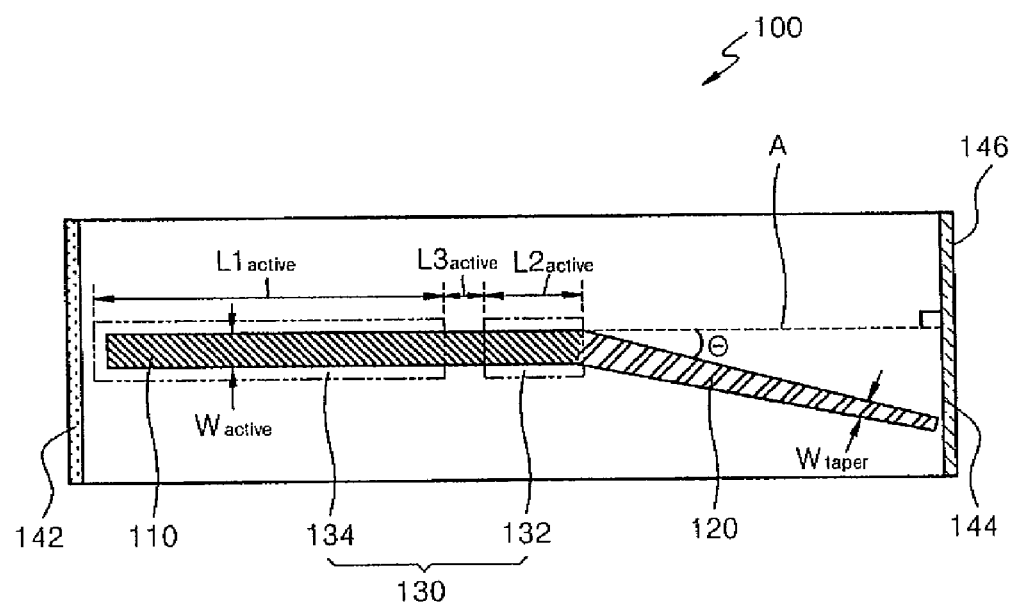
FIG. 4 is a horizontal cross-section of an RSOA into which a passive spot-size convert is integrated, according to an embodiment of the present invention.

FIG. 4 is a horizontal cross-section of an RSOA 100 into which a passive spot-size converter is integrated, according to an embodiment of the present invention. The RSOA 100 has a similar structure to that of the RSOA 10 illustrated in FIG. 1A or 1B. However, a p-type electrode 130, which supplies current to allow the RSOA 100 to operate in a gain-saturation region, is divided into first and second portions 134 and 132. Accordingly, an active region 110, in which amplification occurs, is also divided into two portions. The second portion 132 beside a spot-size converter 120 amplifies low optical power input to the RSOA 100 so that the RSOA 100 operates in the gain-saturation region. The second portion 132 performs remodulation to generate an upstream signal. The first portion 134 near a high-reflective (HR) coating facet 142 squeezes the input optical power. Accordingly, only a direct current is supplied to the first portion 134 while a bias current and a radio frequency (RF) current including data are supplied to the second portion 132.

In an overall operation of the RSOA 100, a signal input to an exit surface 146 is amplified in the second portion 132 and then input to the first portion 134. The signal is squeezed in the first portion 134 and reflected from the HR coating facet 142 to the second portion 132. The signal is remodulated in the second portion 132 and output through the exit surface 146 having an anti-reflective (AR) coating facet 144.

Alternatively, only a direct current may be supplied to the second portion 132 while a bias current and an RF current including data may be supplied to the first portion 134, so that functions of the two portions 132 and 134 can be switched.

A length $L1_{active}$ of the first portion 134, a length $L2_{active}$ of the second portion 132, and a length $L3_{active}$ of a gap between the first portion 134 and the second portion 132 may be appropriately selected considering a gain necessary for the RSOA 100, a permitted length of the RSOA 100, crosstalk between the two portions 132 and 134, etc. For example, when the permitted length of the RSOA 100 is 1500 µm and the length of the spot-size converter 120 is 300 µm; the lengths $L1_{active}$, $L2_{active}$, and $L3_{active}$ may be respectively set to 200-800 µm, 50-400 µm, and 10-50 µm.

Figure 3A:
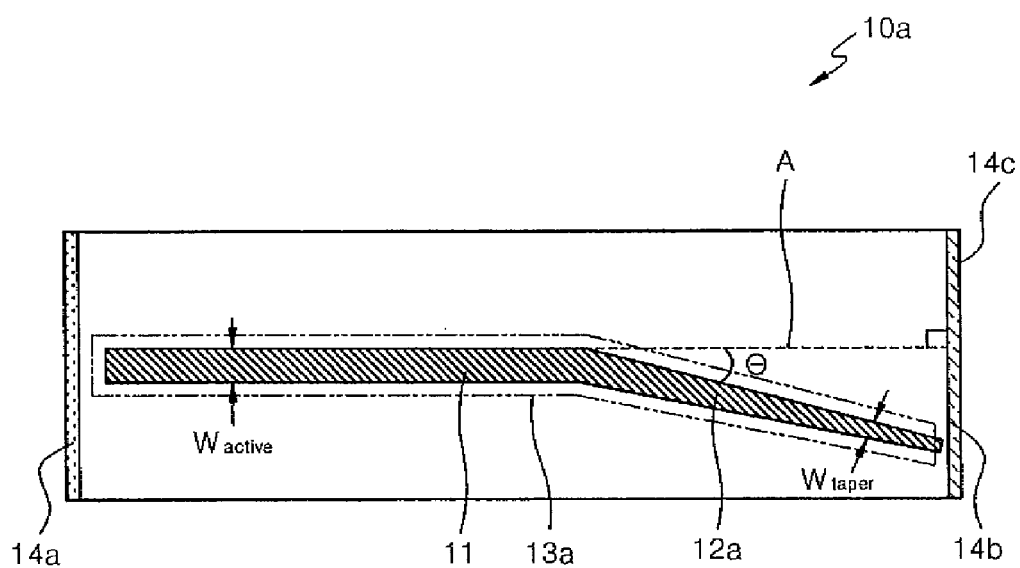
FIGS. 3A and 3B are horizontal and vertical cross-sections of an RSOA into which a conventional active spot-size converter is integrated.
Figure 3B:
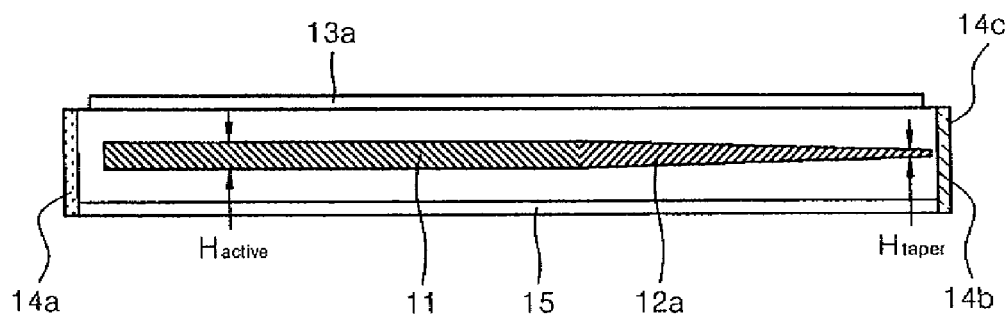
Figure 5A:
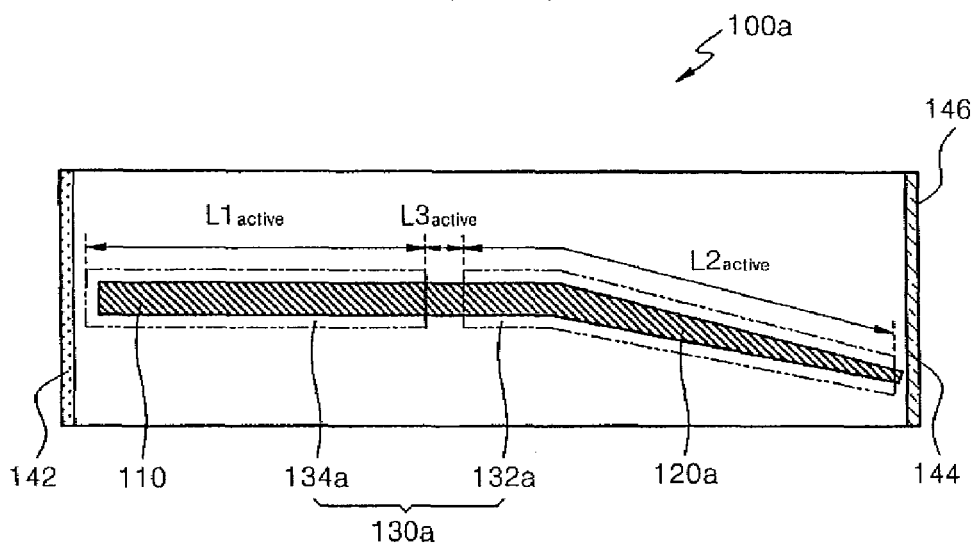
FIGS. 5A through 5C are horizontal cross-sections of RSOAs into which an active spot-size converter is integrated, according to other embodiments of the present invention.
Figure 5B:
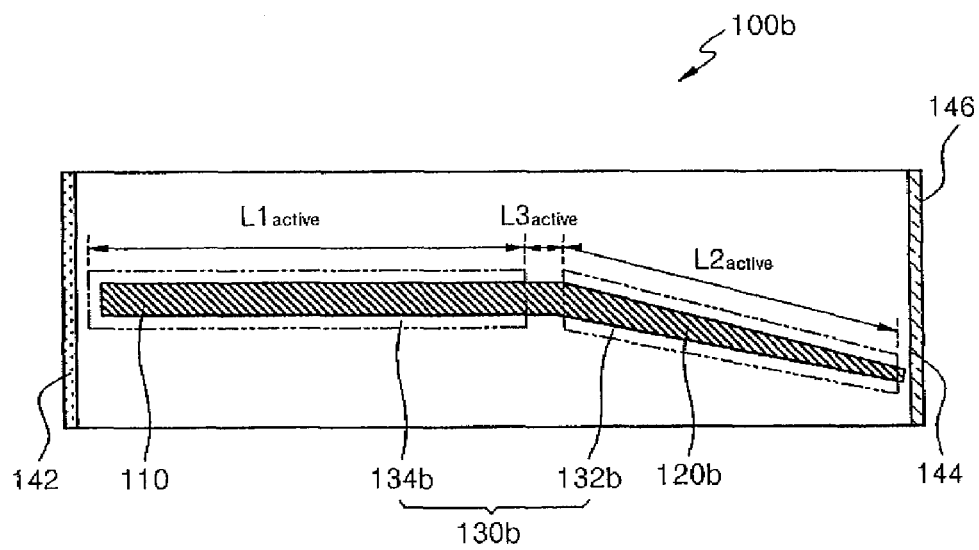
Figure 5C:
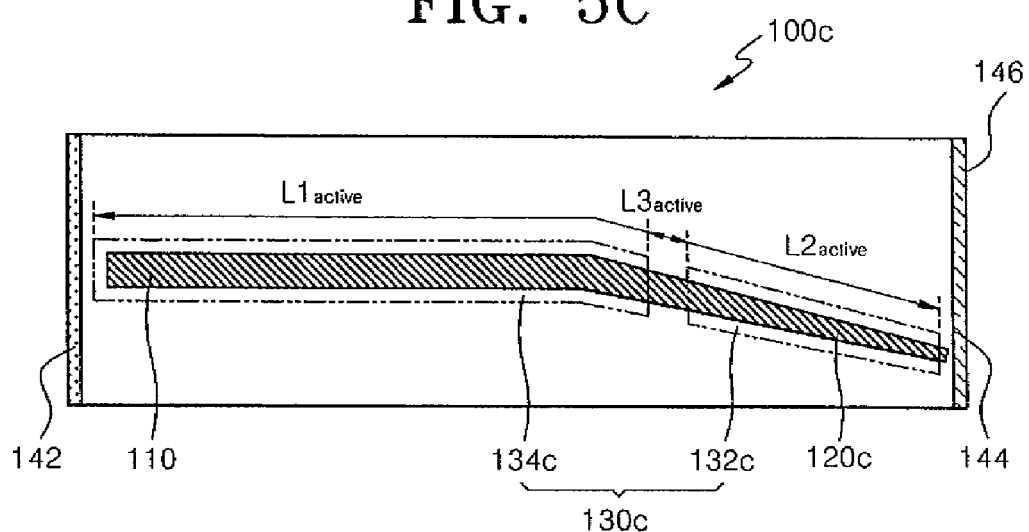

FIGS. 5A through 5C are horizontal cross-sections of RSOAs 100a, 100b, and 100c, into which an active spot-size converter is integrated, according to other embodiments of the present invention. The RSOAs 100a, 100b, and 100c have similar structures to that of the RSOA 10a illustrated in FIG. 3A or 3B, with the exception that a p-type electrode is divided into two portions, as illustrated in FIG. 4, so that an active region is also divided into two portions. P-type electrodes 130a, 130b, and 130c are formed on the active region 110 and spot-size converters 120a, 120b, and 120c, respectively. A gap between two portions 132a and 134a, 132b and 134b, or 132c and 134c of each of the p-type electrodes 130a, 130b, and 130c may be positioned above the active region 110, the interface between the active region 110 and the spot-size converter 120b, or the spot-size converter 120c.

In detail, referring to FIG. 5A, a gap between the two portions 132a and 134a is positioned above the active region 110, likely in the RSOA 100 illustrated in FIG. 4. Referring to FIG. 5B, a gap between the two portions 132b and 134b is positioned near a portion at which a material of the active region 110 is bent to form the spot-size converter 120b. Referring to FIG. 5C, a gap between the two portions 132c and 134c is positioned above the spot-size converter 120c formed using the same material as the active region 110. This is possible because the spot-size converters 120a, 120b, and 120c are formed using the same material as the active region 110 and the p-type electrodes 130a, 130b, and 130c may be formed throughout the active region 110 and the spot-size converters 120a, 120b, and 120c, respectively.

The types of current supplied to the two portions of the active region 110 and the spot-size converter 120a, 120b, or 120c, the function of each portion, the lengths of the portions, and the length of the gap between the portions are the same as those illustrated in FIG. 4. The three different RSOAs 100a, 100b, and 100c have been presented according to a position of the gap in the current embodiments, but the present invention is not restricted thereto. It is apparent that the lengths of the two portions and the length of the gap therebetween can be appropriately selected considering a gain necessary for a RSOA, a permitted length of the RSOA, crosstalk between the two portions, etc.

In the current embodiments, an RSOA has an active region divided into a non-saturated amplification area and a saturated amplification area so that the RSOA can operate in a gain-saturation region even at low input optical power. In addition, since an additional gain region exists, output optical power can be increased.

<<Embodiments of an RSOA Module>>

Figure 6:
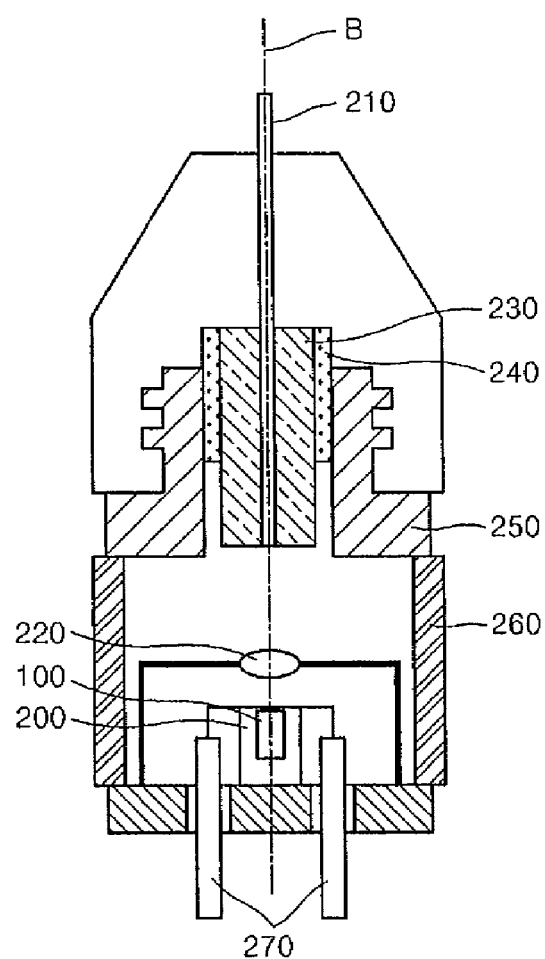
FIG. 6 is a cross-section of an RSOA module in which an RSOA is installed in a TO-CAN, according to an embodiment of the present invention.

FIG. 6 is a cross-section of an RSOA module in which the RSOA 100 is installed in a TO-CAN, according to an embodiment of the present invention. The RSOA 100 includes an active region which is divided into two portions, as illustrated in FIG. 4 or 5.

Referring to FIG. 6, in the RSOA module having a TO-CAN structure, the RSOA 100 is installed in a head 200 of the TO-CAN and is optically connected to an optical fiber 210 via a coupling lens 220 through active alignment. The coupling lens 220 may be a ball lens or an aspheric lens or may be implemented using two or more coupling lenses. After optical alignment (B), the optical fiber 210 is fixed by laser-welding a ceramic ferrule 230 and a metal stub 240 to a body 260 of the TO-CAN and a metal jacket 250.

An electrical signal is input and output through four pins 270 of the TO-CAN for current supply. Only direct current is supplied to one of the four pins 270 for squeezing, bias current and radio frequency (RF) current are supplied together to other two of the four pins 270 for amplification and remodulation, and the rest one pin is used for a common ground electrode. The number of pins for the current supply is not restricted to four and the types of current supply to the pins may be different.

In the current embodiment, in the RSOA module having the TO-CAN structure, the RSOA 100 operates in a gain-saturation region due to an active region divided into two portions, so that the RSOA module has low power penalty.

Figure 7A:
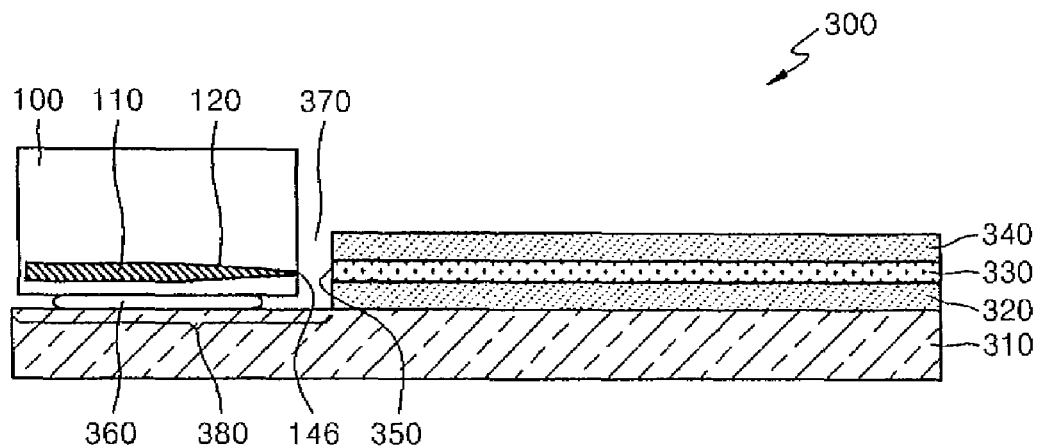
FIGS. 7A and 7B are vertical and horizontal cross-sections of an RSOA module in which an RSOA is installed on a planar lightwave circuit (PLC) platform, according to another embodiment of the present invention.
Figure 7B:
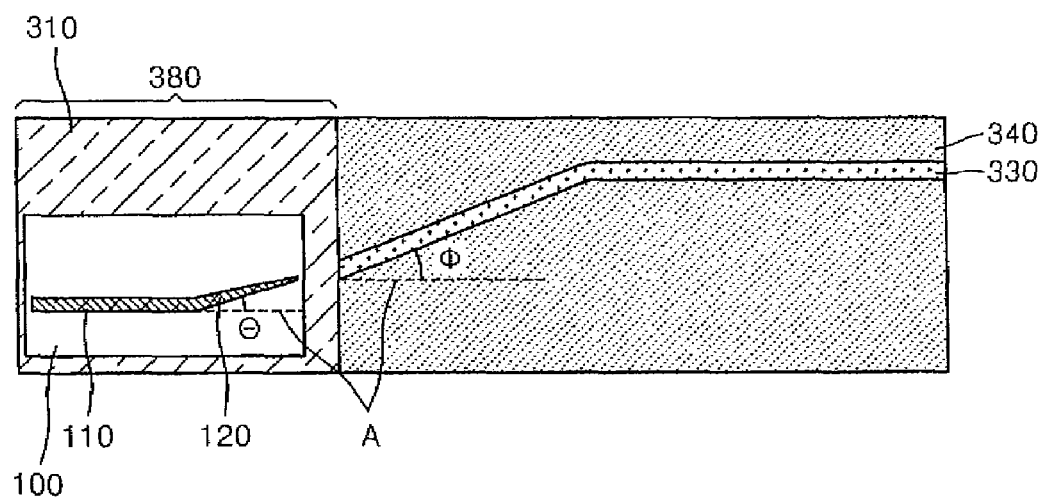

FIGS. 7A and 7B are vertical and horizontal cross-sections of an RSOA module 300, in which the RSOA 100 is installed on a planar lightwave circuit (PLC) platform, according to another embodiment of the present invention. The RSOA 100 also includes an active region which is divided into two portions, as illustrated in FIG. 4 or 5.

Referring to FIG. 7A, the RSOA module 300 having a PLC platform structure includes the RSOA 100, a substrate 310, a lower clad 320, a waveguide core 330, an upper clad 340, and an area 380 to which the RSOA 100 is flip-chip bonded. The flip-chip bonding is performed using a solder 360.

The active region 110 and the spot-size converter 120 are formed within the RSOA 100. The spot-size converter 120 may be a passive or an active type.

Referring to FIG. 7B, the spot-size converter 120 included in the RSOA 100 makes a predetermined angle of θ with respect to a normal A of the exit surface 146 in order to improve an AR property. The predetermined angle of θ may be 0-10 degrees. Meanwhile, since the spot-size converter 120 is slanted at the predetermined angle of θ, the waveguide core 330 of the PLC platform is also slanted at a predetermined angle of Φ with respect to the normal A of a waveguide end surface 350. The predetermined angle of Φ complies with the Snell's law.

A gap 370 between the RSOA 100 and the waveguide end surface 350 may be filled with an appropriate material, which may have a refractive index similar to that of a waveguide. For example, the material may be a polymer, a thermosetting epoxy, or an ultraviolet-curable epoxy. The waveguide of the PLC platform may be formed using a silicon material such as silica ($SiO_2$), a polymer, silicon nitride (SiN), or a silicon oxide nitride (SiON). The waveguide may be formed in a structure such as a channel, a rib, a ridge, or a slab.

In the current embodiment, in the RSOA module 300 having the PLC platform structure, the RSOA 100 also operates in a gain-saturation region due to an active region divided into two portions, so that the RSOA module 300 has low power penalty.

Figure 8:
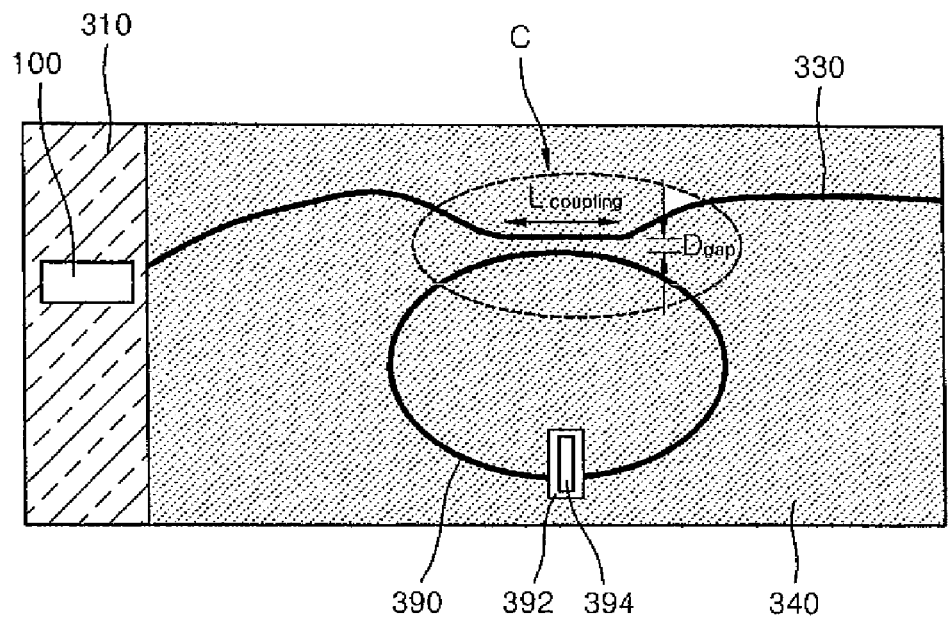
FIG. 8 is a horizontal cross-section of an RSOA module into which a waveplate is inserted, according to still an embodiment of the present invention.

FIG. 8 is a horizontal cross-section of an RSOA module into which a waveplate is inserted, according to still an embodiment of the present invention. This RSOA module is provided to overcome a polarization problem occurring when an RSOA has a quantum-well structured active region and a polarization-dependent gain (PDG) of at least 5 dB.

Referring to FIG. 8, in the RSOA module, the RSOA 100 is installed in a PLC platform, which includes a directional coupler C and a waveplate 394. The directional coupler C is formed by coupling a signal transmission waveguide or core 330 with a polarization waveguide 390. A coupling intensity is determined based on a coupling length $L_{coupling}$ and a gap $D_{gap}$ between the signal transmission waveguide 330 and the polarization waveguide 390. The waveplate 394 is installed at an insertion area 392 in the polarization waveguide 390.

The functions of the directional coupler C and the waveplate 394 will now be described. An optical signal input from an optical fiber progresses through the signal transmission waveguide 330 and meets the polarization waveguide 390 in the directional coupler C. Accordingly, a part of the optical signal progresses through the signal transmission waveguide 330 and the rest part of the optical signal progresses through the polarization waveguide 390. The waveplate 394 in the polarization waveguide 390 changes the polarization of the optical signal and the optical signal whose polarization has been changed is input to the directional coupler C. A part of the optical signal whose polarization has been changed is input to the RSOA 100, and the rest of it is input to the polarization waveguide 390 again, experiences the change of polarization at the waveplate 394, and is then input to the directional coupler C again. Thus, an optical signal with an initial polarization state is divided into half components, i.e., a component with the initial polarization state and a component with a polarization state orthogonal to the initial polarization state, which are input to the RSOA 100.

The phase delay of the waveplate 394 may be $\lambda/4$, $\lambda/2$, or $3\lambda/4$. The waveplate 394 may be a thin-film having a thickness of 50 μm or less. Here, $\lambda$ is a wavelength of an optical signal. The insertion area 392 may be formed using dicing, dry etching, or wet etching.

Meanwhile, the length of the polarization waveguide 390 is related with an upstream transmission speed. For example, to achieve an upstream transmission speed of 1 Gbps, the length of the polarization waveguide 390 needs to be less than 3 cm. To achieve an upstream transmission speed of 100 Mbps, the length of the polarization waveguide 390 needs to be less than 30 cm. The polarization waveguide 390 is formed in a ring shape considering its characteristics.

The RSOA 100 installed in the PLC platform structure may be an RSOA having an active region divided into two portions as illustrated in FIG. 4 or 5 or a conventional RSOA having a structure as illustrated in FIG. 1 or 3. However, it is preferable that the active region in the RSOA 100 has a multiple quantum well structure in order to improve the polarization dependency. In the current embodiment, it is assumed that the PDG is at least 5 dB. However, the present invention can be used for a PDG of less than 5 dB.

In the current embodiment, the RSOA module uses the directional coupler C and the waveplate 394, thereby improving the polarization dependency of the RSOA 100 having a quantum-well structured active region. In addition, when the active region in the RSOA 100 is divided into two portions, light loss can also be reduced.

FIGS. 9A through 9D are horizontal cross-sections of RSOA modules according to other embodiments of the present invention. These RSOA modules are also provided to overcome a polarization problem occurring when the RSOA 100 has a quantum-well structured active region and a PDG of at least 5 dB. However, the RSOA modules illustrated in FIGS. 9A through 9D are different from that illustrated in FIG. 8 in the shape of a directional coupler, the position of a waveplate, or the number of waveplates.

Figure 9A:
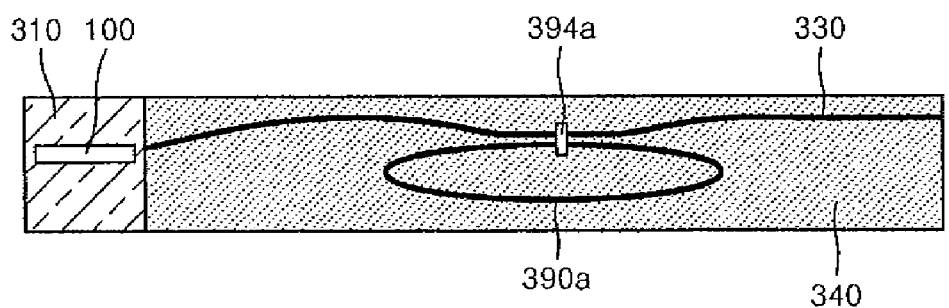
FIGS. 9A through 9D are horizontal cross-sections of RSOA modules according to other embodiments of the present invention.
Figure 9B:
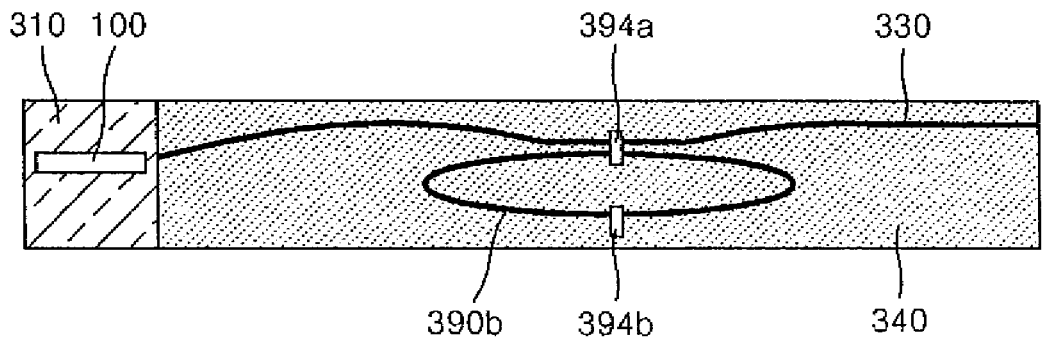
Figure 9C:
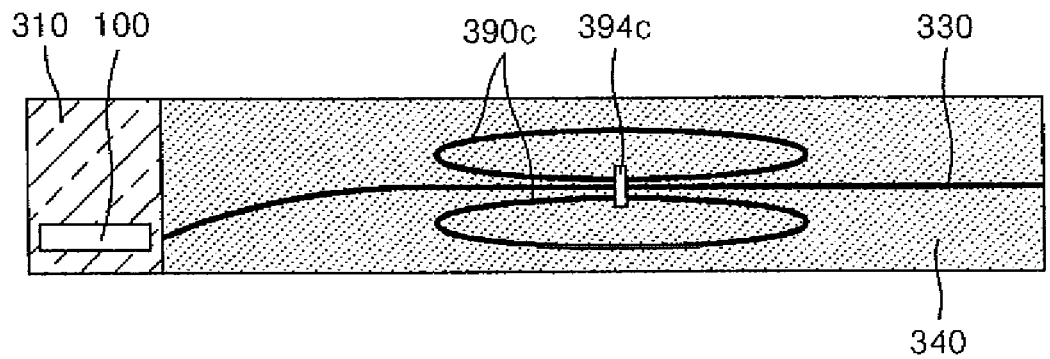
Figure 9D:
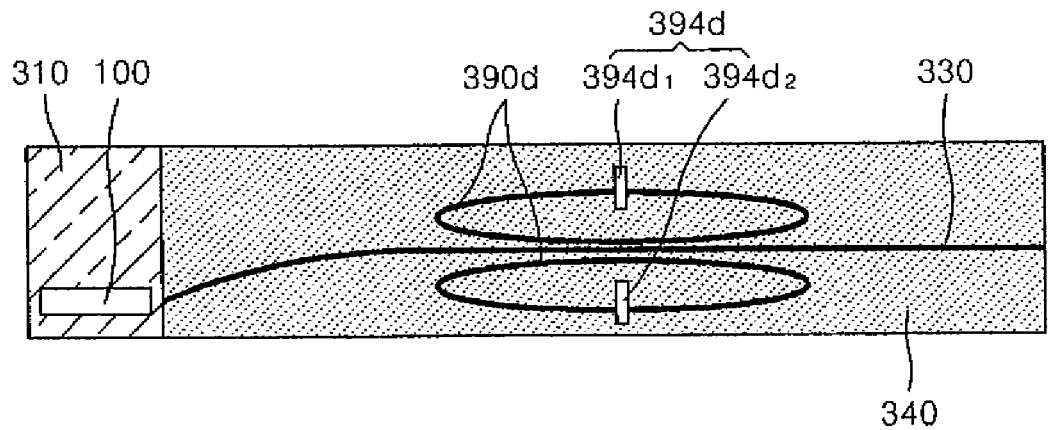

In the RSOA module illustrated in FIG. 9A, a waveplate 394a is inserted into a portion where a directional coupler is formed. In the RSOA module illustrated in FIG. 9B, two waveplates 394a and 394b are inserted: one is inserted into a directional coupler and the other is inserted into an opposite portion. In the RSOA module illustrated in FIG. 9C, two polarization waveguides 390c are formed and a waveplate 394c is inserted into a direction coupler formed by three waveguides. In the RSOA module illustrated in FIG. 9D, two polarization waveguides 390d are formed like in the RSOA module illustrated in FIG. 9C, but two waveplates 394d are respectively inserted into both portions opposite to a directional coupler.

The operating principles of the directional coupler and the waveplates 394a, 394b, 394c, and 394d, phase delay of the waveplates 394a, 394b, 394c, and 394d, and the structures and thicknesses thereof are the same as those described with reference to FIG. 8. The method of forming the portion 392 into which the waveplate 394 is inserted and the lengths and shapes of the waveplates 394a, 394b, 394c, and 394d are also the same as those described with reference to FIG. 8.

The RSOA 100 installed in the PLC platform structure in the current embodiments may be an RSOA having an active region divided into two portions as illustrated in FIG. 4 or 5 or a conventional RSOA having a structure as illustrated in FIG. 1 or 3. However, it is preferable that the active region in the RSOA 100 has a multiple quantum well structure in order to improve polarization dependency. In the description of the current embodiment, it is assumed that the PDG is at least 5 dB. However, the present invention can be used for a PDG of less than 5 dB. The shapes of the polarization waveguides 390a, 390b, 390c, and 390d are not restricted to the current embodiments but may have various shapes.

Figure 10:
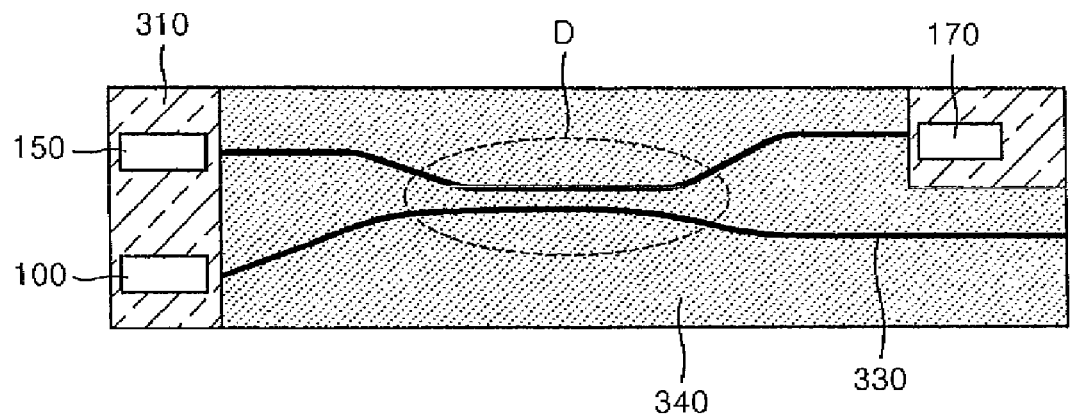
FIG. 10 is a horizontal cross-section of an RSOA module in which an RSOA, a data photodiode (PD), and a monitoring PD are installed together in a PLC platform, according to a further embodiment of the present invention.

FIG. 10 is a horizontal cross-section of an RSOA module, in which the RSOA 100, a data photodiode (PD) 150, and a monitoring PD (mPD) 170 are installed together in a PLC platform, according to a further embodiment of the present invention. Referring to FIG. 10, the RSOA module includes the RSOA 100, the data PD 150, and the mPD 170, which are together installed in the PLC platform, thereby forming a bidirectional ONT module. Elements are optically connected to ends of two signal transmission waveguides 330. In detail, the data PD 150 and the mPD 170 are optically connected to both ends, respectively, of one of the signal transmission waveguides 330; and the RSOA 100 and an optical fiber (not shown) are optically connected to both ends, respectively, of the other of the signal transmission waveguides 330. Meanwhile, the two signal transmission waveguides 330 form a 2×2 directional coupler D through coupling, as illustrated in FIG. 10.

In the operation of the RSOA module according to the current embodiment, a downstream signal input through the optical fiber progresses through one signal transmission waveguide 330 and meets the directional coupler D. The optical power of the downstream signal is divided in the directional coupler D at a designed ratio. Some part of the optical power progresses to the data PD 150 and received as a downstream signal. The other part of the optical power progresses to the RSOA 100 and remodulated into an upstream signal and the upstream signal meets the directional coupler D. Some part of the optical power of the upstream signal is input to the mPD 170 and the magnitude of output optical power is monitored by the mPD 170. The other part of the optical power of the upstream signal progresses through the signal transmission waveguide 330 and is transmitted through the optical fiber as the upstream signal.

The division ratio of the directional coupler D is determined considering light loss in a WE-PON optical link, the gain property of the RSOA 100, and the receive sensitivity of the data PD 150. For example, when the optical link loss is −20 dB, the gain of the RSOA 100 is 10 dB, and the receive sensitivity of the data PD 150 is −20 dBm, the division ratio of the directional coupler D may be 20:80 through 50:50.

Figure 11:
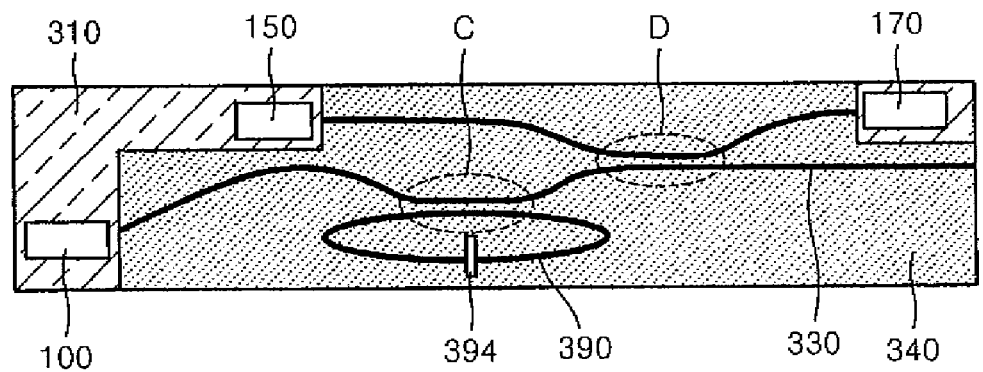
FIG. 11 is a horizontal cross-section of an RSOA module into which a waveplate is inserted, according to another embodiment of the present invention.

FIG. 11 is a horizontal cross-section of an RSOA module, into which the waveplate 394 is inserted, according to another embodiment of the present invention. The RSOA module illustrated in FIG. 11 has a structure in which the waveplate 394 is inserted into the structure of the RSOA module illustrated in FIG. 10. The RSOA module illustrated in FIG. 11 is also provided to overcome a polarization problem occurring when the RSOA 100 has a quantum-well structured active region and a PDG of at least 5 dB.

Referring to FIG. 11, like the RSOA module illustrated in FIG. 10, the RSOA 100, the data PD 150, and the mPD 170 are installed in a PLC platform, whereby the RSOA module illustrated in FIG. 11 has a bidirectional ONT module structure. The polarization waveguide 390, into which the waveplate 394 is inserted to improve polarization dependency, and the directional coupler C formed through coupling between the signal transmission waveguide 330 and the polarization waveguide 390 are additionally provided in the RSOA module illustrated in FIG. 11.

In the operation of the RSOA module according to the current embodiment, a downstream signal input through the optical fiber progresses through one signal transmission waveguide 330 and meets the directional coupler D. The optical power of the downstream signal is divided in the directional coupler D at a designed ratio. Some part of the optical power progresses to the data PD 150 and received as a downstream signal. The other part of the optical power is divided again in the directional coupler C and is partially input to the polarization waveguide 390. As described with reference to FIG. 8, the directional coupler C, the polarization waveguide 390, and the waveplate 394 serve to divide the polarization of an input signal into half components, i.e., an original polarization component and an orthogonal polarization component, which are input to the RSOA 100. A downstream signal input to the RSOA 100 is remodulated into an upstream signal. The upstream signal meets the directional coupler D through the directional coupler C. Some part of the optical power of the upstream signal is input to the mPD 170 and thus the magnitude of output optical power is monitored. The other part of the optical power of the upstream signal progresses through the signal transmission waveguide 330 and is transmitted through the optical fiber as the upstream signal.

The operating principles of the directional coupler C and the waveplate 394, phase delay of the waveplate 384, and the structure and thickness thereof are the same as those described with reference to FIG. 8. The method of forming the portion into which the waveplate 394 is inserted and the lengths and shapes of the waveplate 394 are also the same as those described with reference to FIG. 8.

The RSOA 100 installed in the PLC platform structure in the current embodiment may be an RSOA having an active region divided into two portions as illustrated in FIG. 4 or 5 or a conventional RSOA having a structure as illustrated in FIG. 1 or 3. However, it is preferable that the active region in the RSOA 100 has a multiple quantum well structure in order to improve polarization dependency. In addition, the polarization waveguides 390a through 390d formed in various shapes to improve polarization dependency, as illustrated in FIGS. 9A through 9D, may be used in the current embodiment. Other shapes of a polarization waveguide may also be used.

Figure 12:
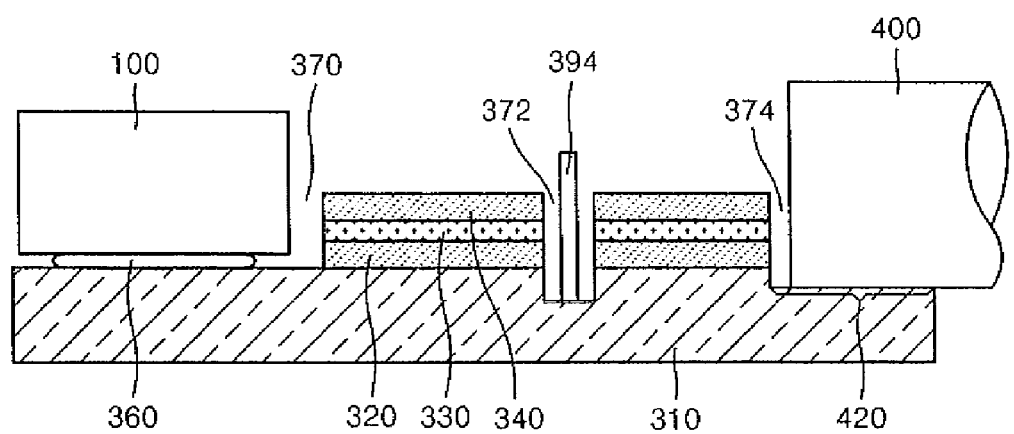
FIG. 12 is a vertical cross-section of an RSOA module with a V-groove according to still another embodiment of the present invention.

FIG. 12 is a vertical cross-section of an RSOA module with a V-groove 420 in a PLC platform structure according to still another embodiment of the present invention. In the RSOA module illustrated in FIG. 12, the RSOA 100 and the waveplate 394 are installed in a PLC platform and the V-groove 420 is formed at a portion of the PLC platform connected with an optical fiber 400 in order to improve optical coupling with the optical fiber. The V-groove 420 may be formed using dry etching and/or wet etching.

The gap 370 between the RSOA 100 and a waveguide end surface, a gap 372 between the waveplate 394 and a waveguide, and a gap 374 between the optical fiber 400 and the waveguide may be filled with a material having a refractive index similar to that of the waveguide. For example, the material may be a polymer, a thermosetting epoxy, or an ultraviolet-curable epoxy.

The RSOA module according to the current embodiment has the V-groove 420 at a portion connected with the optical fiber 400, thereby reducing power penalty due to optical coupling with the optical fiber 400. Meanwhile, the RSOA 100 installed in the PLC platform structure in the current embodiment may be an RSOA having an active region divided into two portions as illustrated in FIG. 4 or 5 or a conventional RSOA having a structure as illustrated in FIG. 1 or 3. However, it is preferable that the active region in the RSOA 100 has a multiple quantum well structure in order to improve polarization dependency. In addition, the polarization waveguides 390a through 390d formed in various shapes to improve polarization dependency, as illustrated in FIGS. 9A through 9D, may be used in the current embodiment. Other shapes of a polarization waveguide may also be used.

<<Embodiments of a PON>>

Figure 13:
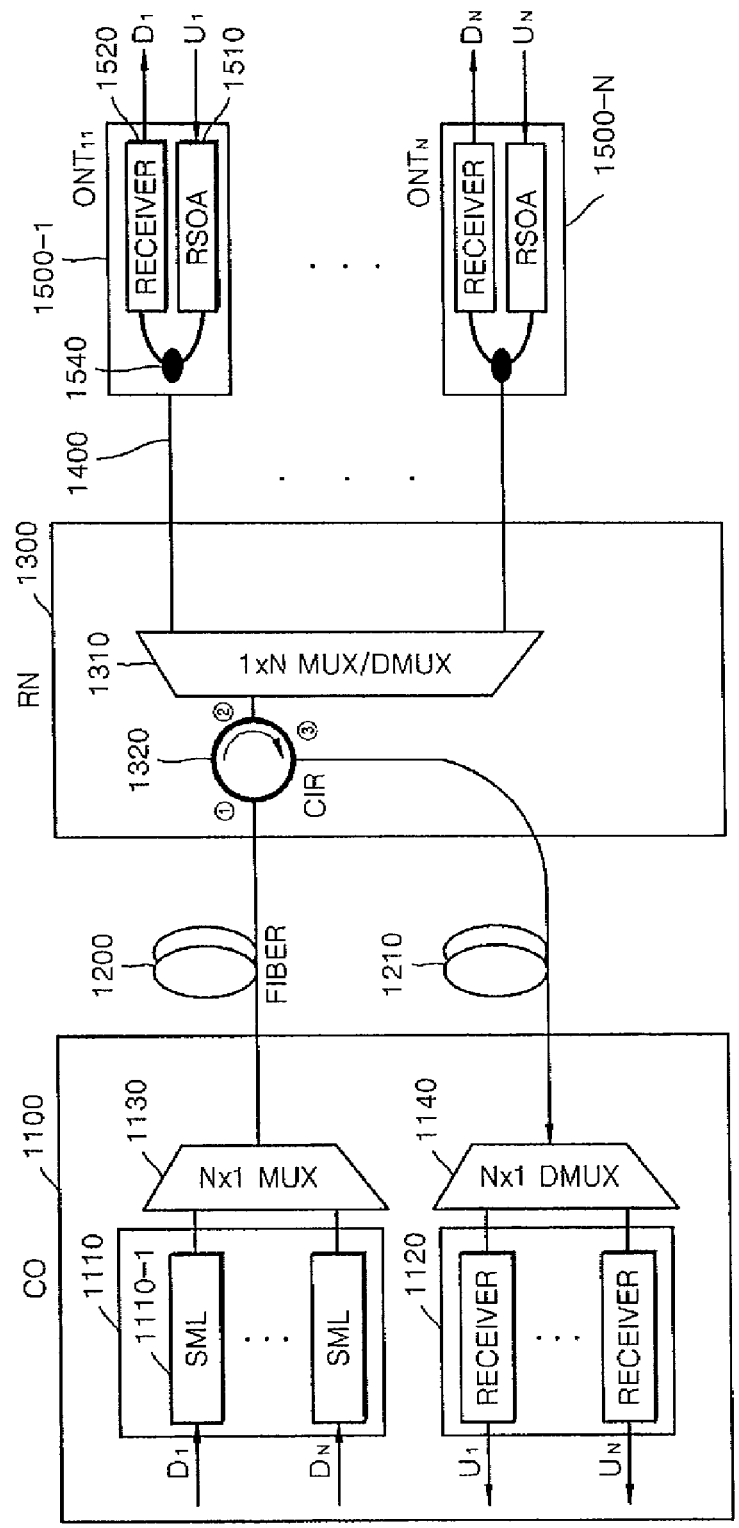
FIG. 13 illustrates the structure of a Passive Optical Network (PON) in which upstream fiber and downstream fiber between a central office and a remote node are separated from each other, according to an embodiment of the present invention.

FIG. 13 illustrates the structure of a PON in which an upstream fiber and a downstream fiber between a central office and a remote node are separated from each other, and more particularly, the structure of a WDM-PON using an RSOA, according to an embodiment of the present invention. Referring to FIG. 13, the WDM-PON includes a central office (CO) 1100, optical fibers 1200 and 1210, a remote node (RN) 1300, and an ONT unit 1500.

The CO 1100 includes an optic source unit 1110 including a plurality of single mode lasers (SMLs) 1110-1, e.g., distributed feedback laser diodes (DFB-LDs), which are arrayed individually or integrally; an optical receiving unit 1120 including a plurality of receivers which are arrayed individually or integrally; an optical multiplexer (MUX) 1130; and an optical demultiplexer (DMUX) 1140.

Each SML 1110-1 in the optic source unit 1110 modulates a downstream signal $D_i$ (where i=1 through N) using light having N intrinsic wavelengths for N ONTs 1500-1 through 1500-N. Each receiver in the optical receiving unit 1120 may be implemented using a PIN-PD or an avalanche PD (APD) and receives an upstream signal (where i=1 through N) from the ONT unit 1500. The optical MUX 1130 multiplexes outputs of the N SMLs 1110-1 and transmits a multiplexed signal to the optical fiber 1200, which transmits a downstream signal. The optical DMUX 1140 demultiplexes an upstream signal and transmits demultiplexed signals to the receivers, respectively, of the optical receiving unit 1120.

The remote node 1300 includes a circulator 1320 and an optical MUX/DMUX 1310. The circulator 1320 separates an upstream signal from a downstream signal. The optical MUX/DMUX 1310 may be implemented using a single arrayed waveguide grating (AWG) or a thin film filter (TFF). The optical MUX/DMUX 1310 demultiplexes the downstream signal from the circulator 1320 and transmits demultiplexed signals to the ONT unit 1500. In addition, the optical MUX/DMUX 1310 multiplexes upstream signals and transmits a multiplexed signal to the circulator 1320. In other words, a multiplexed downstream signal input to the optical MUX/DMUX 1310 after passing through the optical fiber 1200 and the circulator 1320 is divided into signals in different wavelengths, which are transmitted via an optical fiber 1400 to the respective ONTs 1500-1 through 1500-N included in the ONT unit 1500.

Each of the ONTs 1500-1 through 1500-N, e.g., the ONT 1500-1, includes an RSOA 1510, a receiver 1520, and a coupler 1540, which may be implemented as individual elements or may be integrated into a single substrate. The coupler 1540 divides and distributes optical power of a downstream signal received through the optical fiber 1400 to the RSOA 1510 and the receiver 1520 with consideration of a power budget and gain saturation input power of the RSOA 1510. The receiver 1520 receives the downstream signal $D_i$ while the RSOA 1510 remodulates the downstream signal $D_i$ into the upstream signal $U_i$ and transmits the upstream signal $U_i$ to the CO 1100.

Optical signals output from RSOAs 1510 in the respective ONTs 1500-1 through 1500-N are transmitted through the optical fiber 1400 to and multiplexed by the optical MUX/DMUX 1310 in the RN 1300. A multiplexed optical signal is transmitted to the CO 1100 through the circulator 1320 and the optical fiber 1210, which transmits an upstream signal. The multiplexed optical signal input to the CO 1100 is demultiplexed into upstream signals in different channels by the optical DMUX 1140. The upstream signals are finally received by the respective receivers in the optical receiving unit 1200.

In the PON according to the current embodiment, both an upstream signal and a downstream signal are transmitted through a single optical fiber between an RN and an ONT using a coupler, so that the cost for optical fiber is reduced. Although the conventional RSOA illustrated in FIG. 1 or 3 may be used in the ONT, it is preferable to use the RSOA including an active region divided into two regions as illustrated in FIG. 4 or 5 in the ONT in order to reduce power penalty. In addition, an RSOA module used in the ONT may have any structure between a TO-CAN and a PLC platform. However, when the active region included in the RSOA has a multiple quantum well structure, the RSOA module having the PLC platform structure in which a waveplate is inserted, as illustrated in any of FIGS. 8 through 12, may be used in order to improve polarization dependency.

Figure 14:
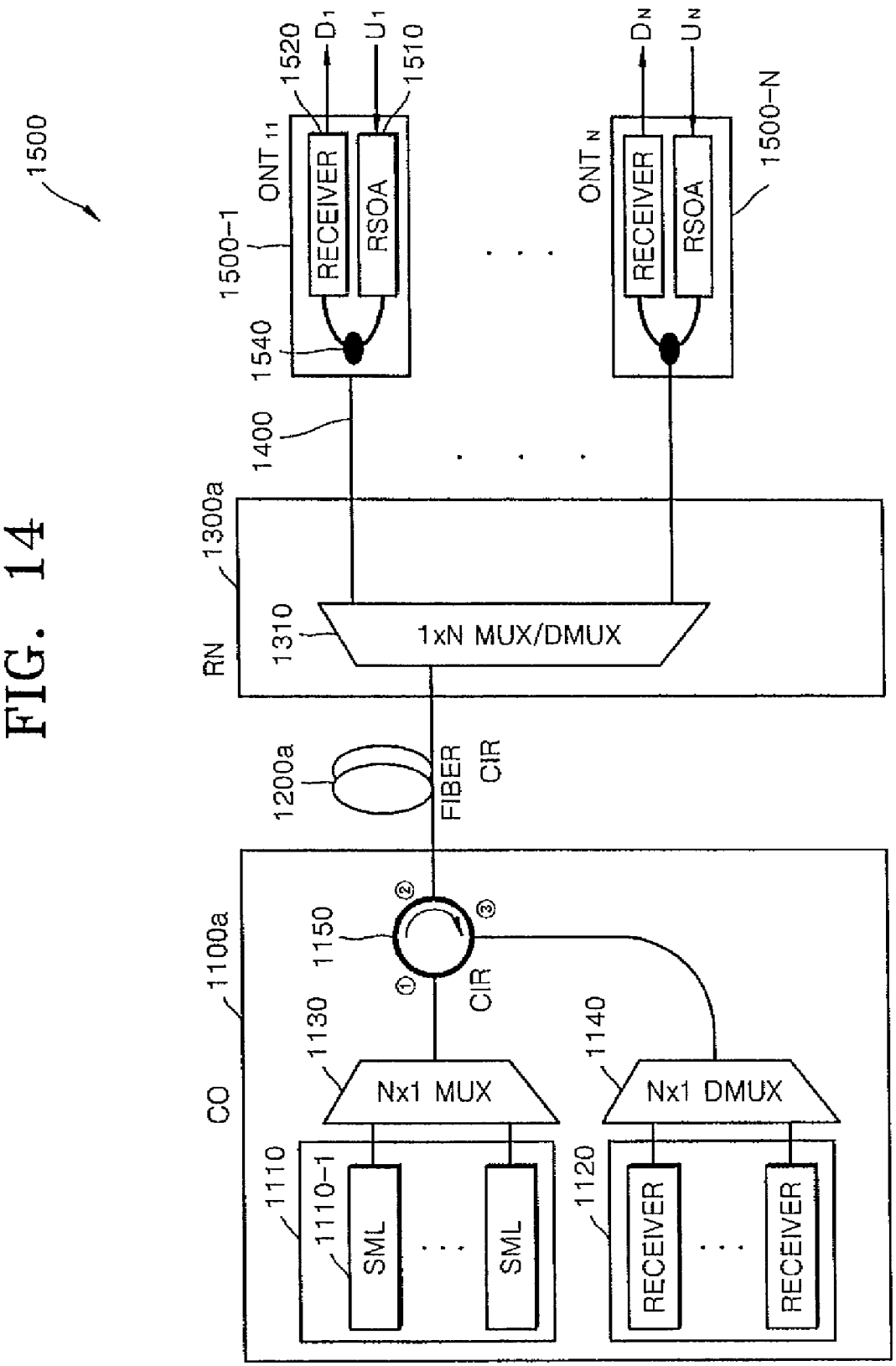
FIG. 14 illustrates the structure of a PON in which upstream fiber and downstream fiber between a central office and a remote node are united, according to another embodiment of the present invention.

FIG. 14 illustrates the structure of a PON, in which an upstream fiber and a downstream fiber between a CO and an RN are united, according to another embodiment of the present invention. The PON illustrated in FIG. 14 is similar to that illustrated in FIG. 13 but is different therefrom in the number of optical fibers and the position of a circulator.

Referring to FIG. 14, the PON includes a single optical fiber 1200a, which transmits a signal between a CO 1100a and an RN 1300a. A circulator 1150 is positioned in the CO 1100a.

In the operation of the PON illustrated in FIG. 14, downstream signals output from the SMLs 1110-1 in the optic source unit 1110 are multiplexed by the optical MUX 1130. A multiplexed downstream signal is transmitted to the optical fiber 1200a via the circulator 1150. The multiplexed downstream signal is input to the optical MUX/DMUX 1310 in the RN 1300a and divided into signals in different wavelengths. The divided downstream signals are input to the ONT unit 1500 through the optical fiber 1400. Each of the downstream signals is input to the RSOA 1510 and the receiver 1520 through the coupler 1540. The downstream signal input to the RSOA 1510 is remodulated into an upstream signal while the downstream signal input to the receiver 1520 is restored. Upstream signals output from RSOAs 1510 included in the respective ONTs 1500-1 through 1500-N are transmitted through the optical fiber 1400 to and multiplexed by the optical MUX/DMUX 1310. A multiplexed upstream signal is transmitted through the optical fiber 1200a to the CO 1100a. The multiplexed upstream signal input to the CO 1100a is transmitted to the optical DMUX 1140 through the circulator 1150 and divided into signals in different wavelengths. The signals in different wavelengths are respectively received and restored to original data signals by the receivers in the optical receiving unit 1120.

In the PON according to the current embodiment, since only a single optical fiber is used between a CO and an RN, cost for optical fiber is more reduced. The use of an RSOA and an RSOA module is the same as that described with reference to FIG. 13.

Figure 15:
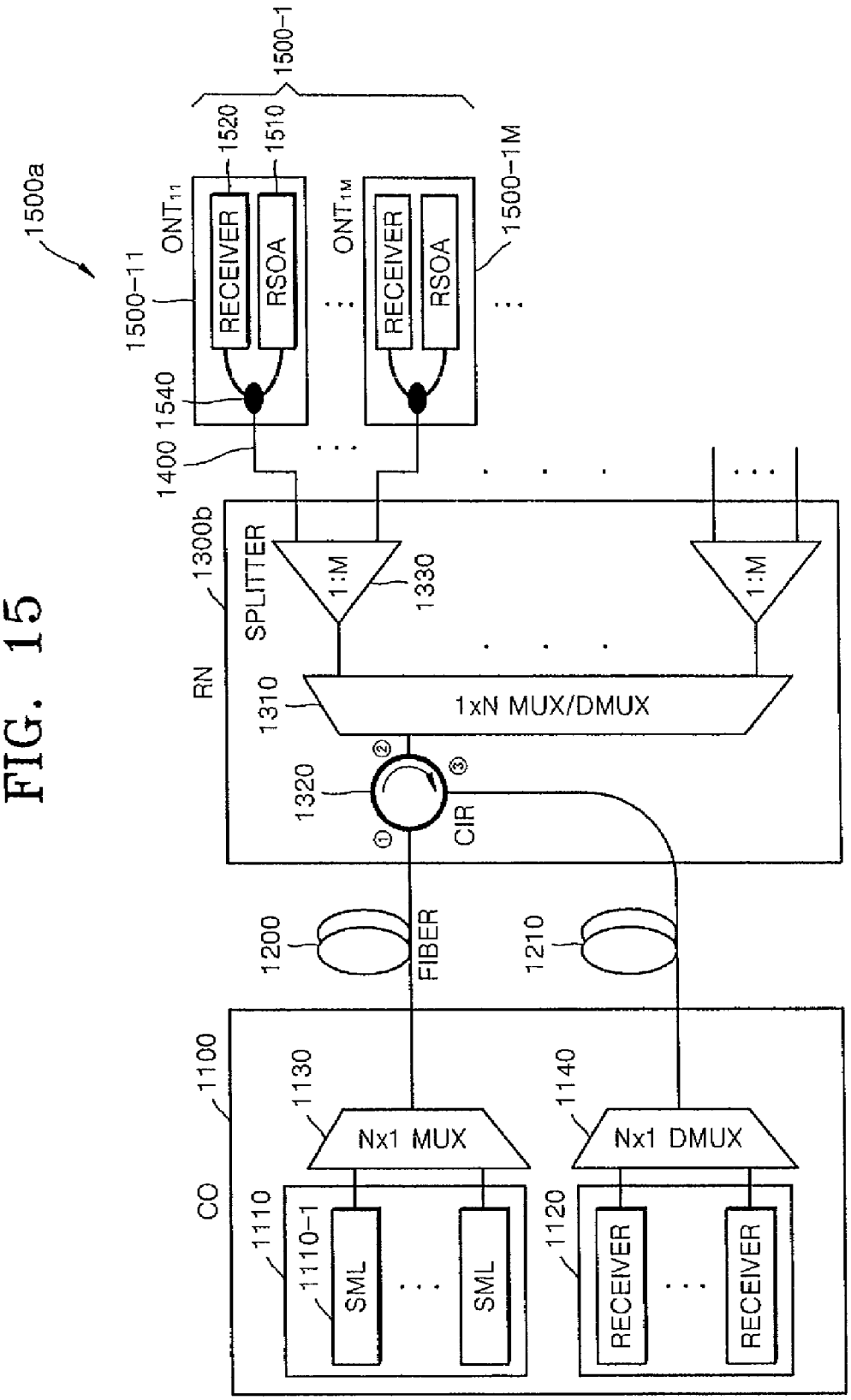
FIG. 15 illustrates the structure of a PON manufactured by applying a Time Division Multiplexing (TDM) system to the PON illustrated in FIG. 13, according to still another embodiment of the present invention.

FIG. 15 illustrates the structure of a PON, manufactured by applying a TDM system to the PON illustrated in FIG. 13, according to still another embodiment of the present invention. The PON illustrated in FIG. 15 is similar to the PON illustrated in FIG. 13, which has the two separated optical fibers 1200 and 1210 respectively for upstream and downstream, with the exception that an RN 1300b further includes a plurality of optical power splitters 1330. Each optical power splitter 1330 is used to apply TDM to each optical wavelength and has a split ratio of 1:M, where M is a natural number. The split ratio of the optical power splitter 1330 may be determined considering the power budget of an entire optical link and the gain saturation input power of an RSOA.

In the operation of the PON according to the current embodiment, downstream signals output from the optical MUX/DMUX 1310 in different wavelengths are transmitted to M ONTs 1500-11 through 1500-1M through a corresponding optical power splitter 1330. In other words, when the optical MUX/DMUX 1310 has a multiplexing ratio of 1:N, a total of N×M ONTs can be accommodated. That is, the PON according to the current embodiment can accommodate M times more ONTs than a conventional PON using a single wavelength band.

A downstream signal transmitted through the optical power splitter 1330 and the optical fiber 1400 is input to the RSOA 1510 and the receiver 1520 through the coupler 1540. The downstream signal input to the RSOA 1510 is remodulated into an upstream signal. The receiver 1520 restores the downstream signal. The downstream signal input to the receiver 1520 includes information to be separately sent to M subscribers in a TDM mode, and therefore, the receiver 1520 extracts only corresponding information. In addition, for an upstream signal output from the RSOA 1510, information is inserted into a time slot assigned to the RSOA 1510 so that the upstream signal output from the RSOA 1510 included in one ONT does not collide with other upstream signals output from the RSOAs 1510 included in the other M−1 ONTs. In this manner, the upstream signals are transmitted to the CO 1100.

The upstream signals output from the M ONTs 1500-11 through 1500-1M in the TDM mode are mixed by the optical power splitter 1330 in the RN 1300b. Output signals of the plurality of the optical power splitters 1330 are multiplexed by the optical MUX/DMUX 1310 and then transmitted to the circulator 1320. A multiplexed upstream signal output from the circulator 1320 transmitted through the optical fiber 1210 for upstream transmission to the CO 1100. The multiplexed upstream signal input to the CO 1100 is demultiplexed into signals in different wavelengths, which are respectively input to the receivers in the optical receiving unit 1120. Each receiver in the optical receiving unit 1120 is a burst-mode receiver and has an enough dynamic range to compensate for an optical power difference between upstream signals output from M ONTs connected to one optical power splitter 1330.

The PON according to the current embodiment includes a time division multiplexer, i.e., an optical power splitter in an RN, thereby remarkably increasing the number of ONTs. In other words, the PON according to the current embodiment can overcome the conventional problems of the restriction of a wavelength band and interval and the restriction of the number of subscribers. Meanwhile, the use of an RSOA and an RSOA module is the same as that described with reference to FIG. 13. In particular, since power penalty increases in proportion to the number of ONTs when TDM is used, it is preferable to use an RSOA having an active region divided into two portions as illustrated in FIG. 4 or 5.

Figure 16:
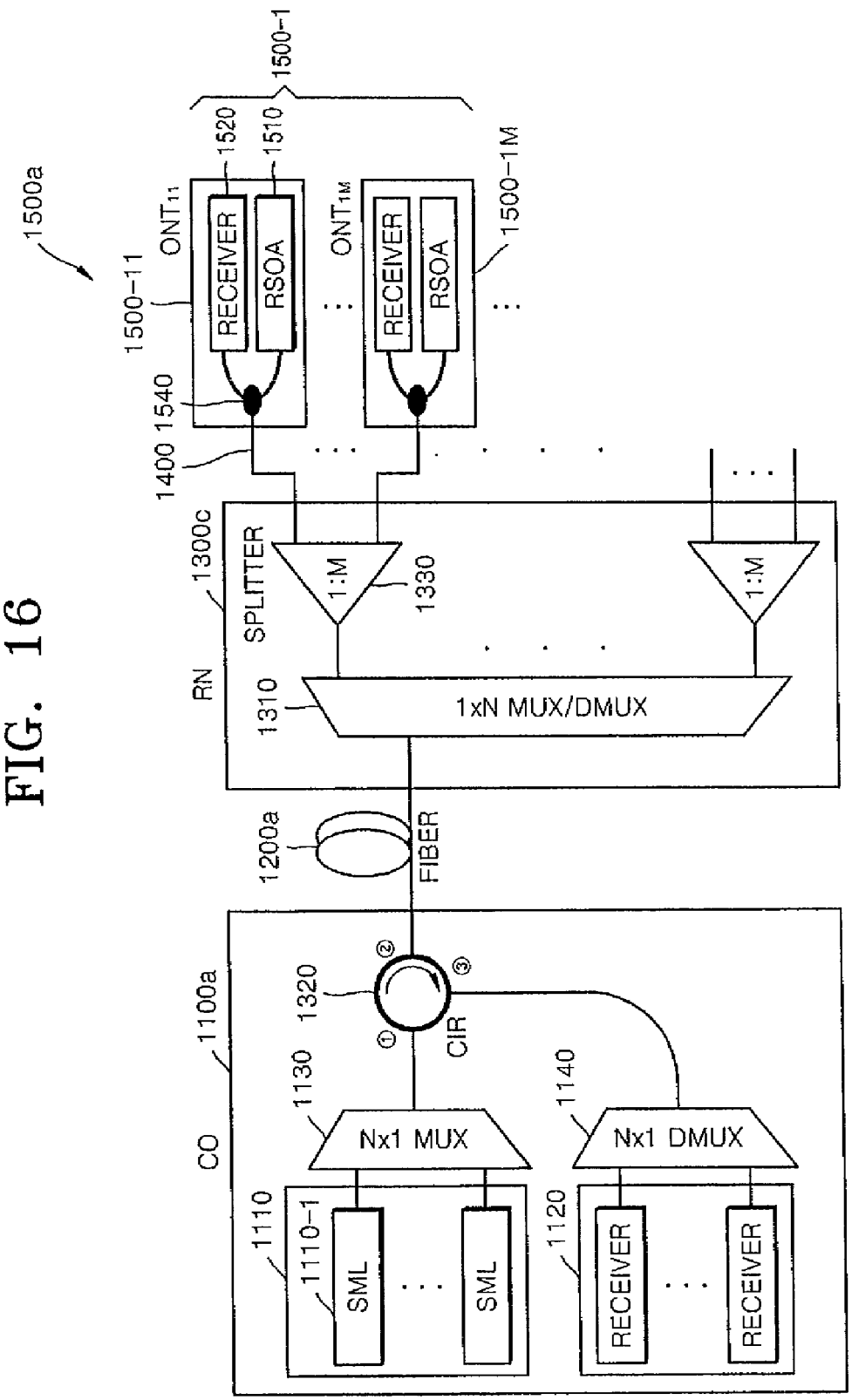
FIG. 16 illustrates the structure of a PON manufactured by applying a TDM system to the PON illustrated in FIG. 14, according to yet another embodiment of the present invention.

FIG. 16 illustrates the structure of a PON, manufactured by applying a TDM system to the PON illustrated in FIG. 14, according to yet another embodiment of the present invention. The PON illustrated in FIG. 16 is similar to that illustrated in FIG. 15 but is different therefrom in the number of optical fibers and the position of a circulator.

Referring to FIG. 16, the PON includes a plurality of the optical power splitters 1330 using TDM like the PON illustrated in FIG. 15 while it uses the single optical fiber 1200*a* for both of upstream and downstream between the CO 1100*a* and an RN 1300*c* like the PON illustrated in FIG. 14. In addition, the PON illustrated in FIG. 16 includes the circulator 1320 in the CO 1100*a*.

The operation and features of the PON illustrated in FIG. 16 are the same as those of the PONs illustrated in FIGS. 14 and 15. In other words, the PON according to the current embodiment increases the number of ONTs using an optical power splitter and is economically advantageous since only a single optical fiber is used between an OC and an RN.

Figure 17:
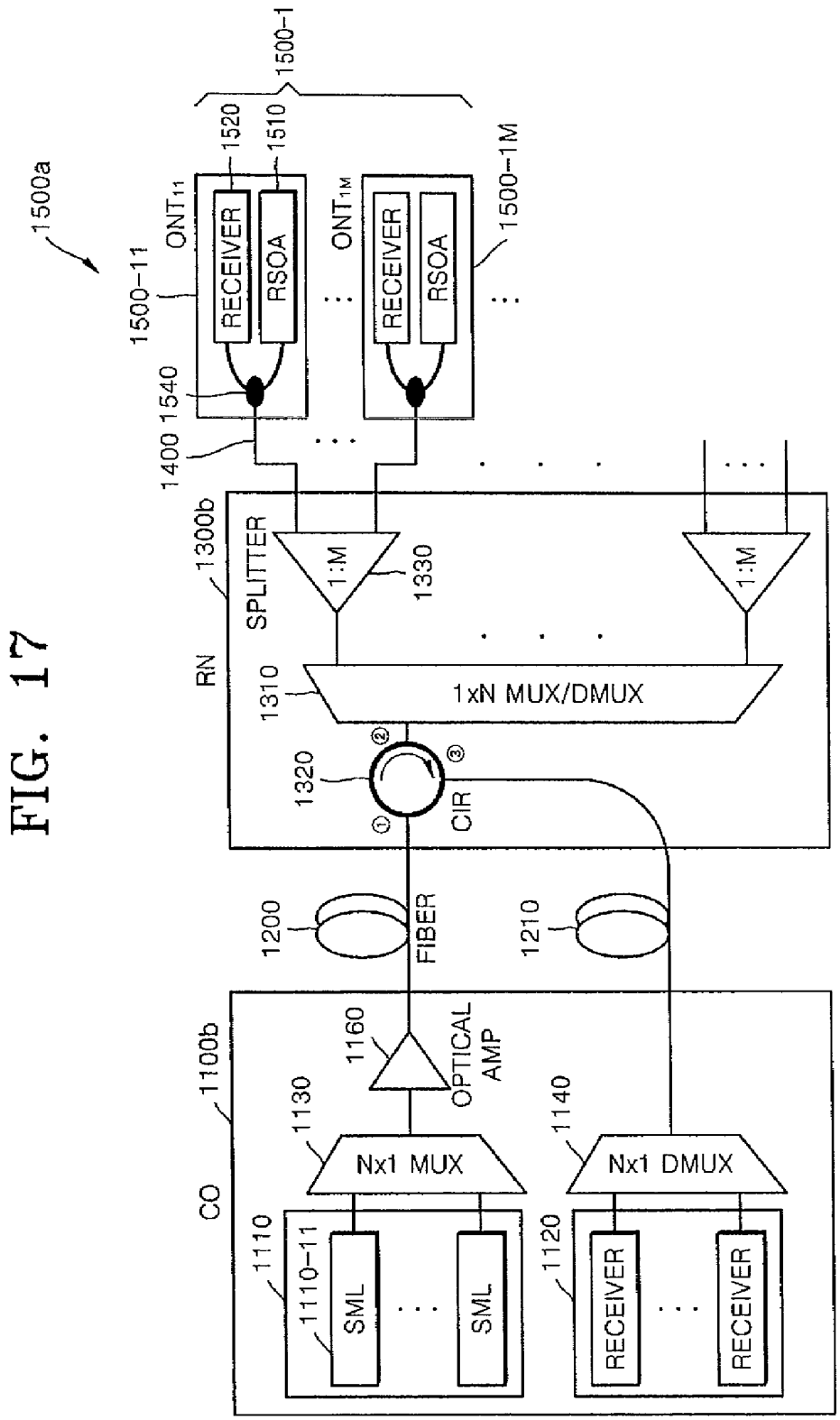
FIG. 17 illustrates the structure of a PON manufactured by applying an optical amplifier to the PON illustrated in FIG. 15, according to a further embodiment of the present invention.

FIG. 17 illustrates the structure of a PON manufactured by applying an optical amplifier to the PON illustrated in FIG. 15, according to a further embodiment of the present invention. The PON illustrated in FIG. 17 is similar to that illustrated in FIG. 15 but further includes an optical amplifier (AMP) 1160 in a CO 1100*b*. When the optical power splitter 1330 having a split ratio of 1:M is used like in the PON illustrated in FIG. 15, a power penalty of 1/M usually occurs. This power penalty causes a decrease in a power budget, a restriction of the number of subscribers, and a decrease in power margin. To overcome these problems, the optical AMP 1160 is installed in the CO 1100*b* in the current embodiment. The optical AMP 1160 may be an erbium-doped fiber amplifier (EDFA).

The PON according to the current embodiment allows a downstream signal multiplexed by the optical MUX 1130 in the CO 1100*b* to obtain a gain in the optical AMP 1160, thereby compensating for loss occurring in the optical power splitter 1330 in the RN 1300*b*. When the power penalty problem is solved, other problems, i.e., the restriction of the number of subscribers and the decrease in the power margin are also overcome. The other operation and features of the current embodiment are the same as those of the previously-described embodiments.

Figure 18:
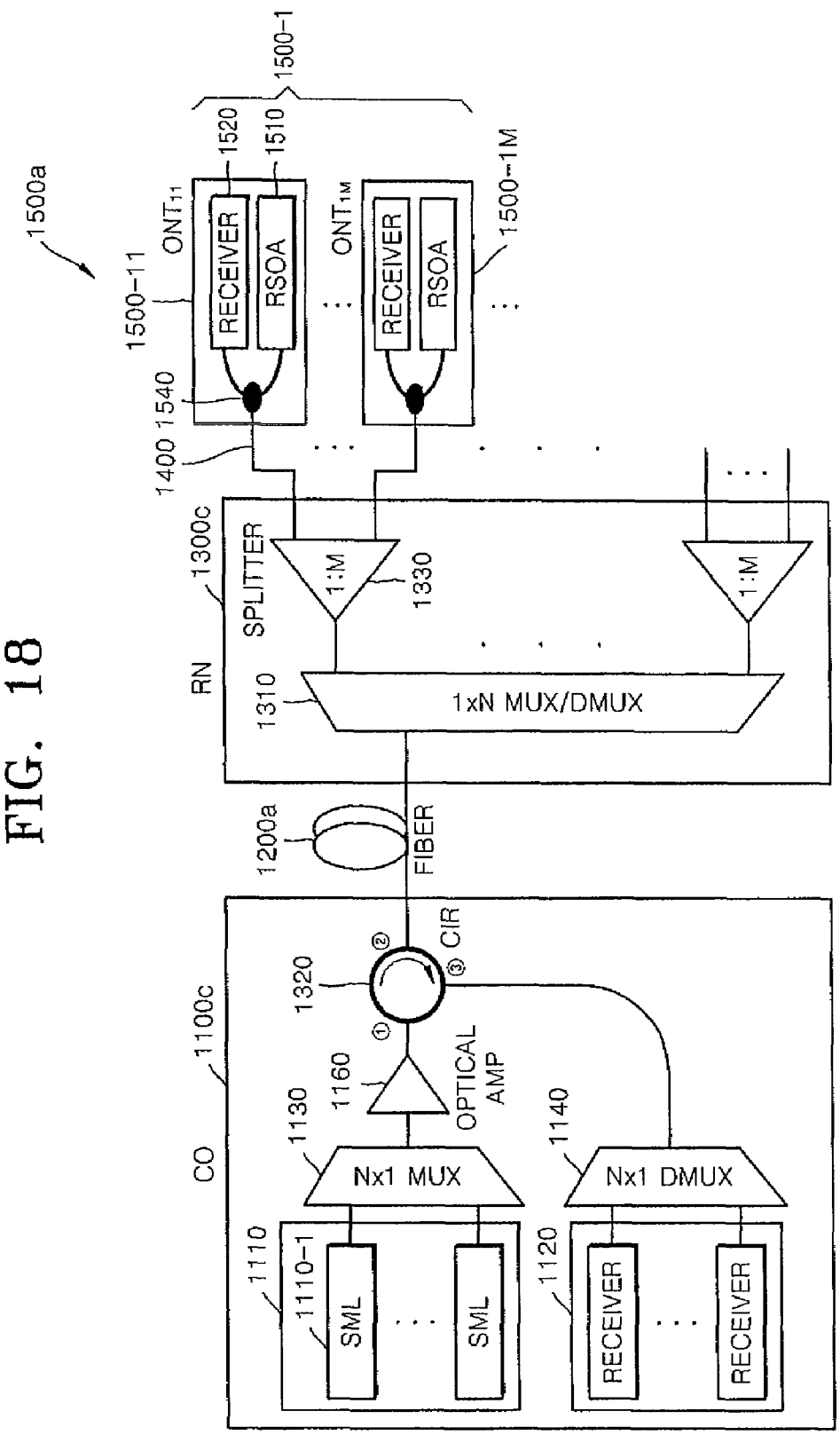
FIG. 18 illustrates the structure of a PON manufactured by applying an optical amplifier to the PON illustrated in FIG. 16, according to another embodiment of the present invention.

FIG. 18 illustrates the structure of a PON manufactured by applying the optical AMP 1160 to the PON illustrated in FIG. 16, according to another embodiment of the present invention. The PON illustrated in FIG. 18 is similar to the PON illustrated in FIG. 16 but is different therefrom in that it further includes the optical AMP 1160.

The PON illustrated in FIG. 18 reduces the cost for optical fiber and overcome a problem of power penalty due to the use of an optical power splitter. The other operation and features of the current embodiment are the same as those of the previously-described embodiments.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

As described above, in an RSOA according to the present invention, an active region is divided into a non-saturated amplification area and a saturated amplification area and thus can operate in a gain-saturation region even at low input optical power. In addition, since an additional gain region exists, output optical power is increased.

An RSOA module according to the present invention improves polarization dependency using a waveplate and thus can use an RSOA including an active region having a multiple quantum well structure. Accordingly, since the gain and saturation properties of the RSOA are good and an uncooled operation is possible, a temperature stability problem of the RSOA as an ONT optic source is solved. In addition, cost for elements is also reduced.

A PON according to the present invention uses a method combining a WDM-PON with TDM, i.e., a WE-PON by adding an optical power splitter having a split ratio of 1:M, thereby accommodating M times more subscribers than a conventional PON, in which the number of subscribers is restricted by the number of ports in a WDM optical MUX/DMUX and the number of wavelengths of an optic source that can be installed in a CO. In addition, the present invention uses an optical amplifier in the CO, thereby securing a power budget of a network during transmission of upstream signals and downstream signals. As a result, the reliability of the network and the number of subscribers are increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A passive optical network (PON) using a reflective semiconductor optical amplifier (RSOA), the PON comprising:
 a central office comprising a plurality of first optic sources transmitting a downstream signal and a plurality of first receivers receiving an upstream signal;
 at least one optical network terminal (ONT) comprising a second receiver receiving the downstream signal and an RSOA which receives the downstream signal,
 remodulates the downstream signal into the upstream signal, and
 transmits the upstream signal in loopback mode; and
 a remote node interfacing the central office with the ONT, wherein the upstream signal and the downstream signal are transmitted between the remote node and the ONT via a single optical fiber,
 wherein the plurality of first optical sources are the only optical sources used.

2. The PON of claim 1, wherein the RSOA comprises:
an active region performing amplification;
a p-type electrode supplying current to the active region;
an anti-reflective coating facet through which a signal is input and output; and
a high-reflective coating facet reflecting a signal,
wherein the anti-reflective coating facet and the high-reflective coating facet are formed at both ends, respectively, of the RSOA; and the p-type electrode is divided into a first portion and a second portion with a predetermined gap between the two portions.

3. The PON of claim 1, wherein the remote node comprises:
an optical multiplexer/demultiplexer; and
an optical power splitter installed at a port of the optical multiplexer/demultiplexer to be connected to the ONT.

4. The PON of claim 3, wherein the RSOA comprises:
an active region performing amplification;
a p-type electrode supplying current to the active region;
an anti-reflective coating facet through which a signal is input and output; and
a high-reflective coating facet reflecting a signal,
wherein the anti-reflective coating facet and the high-reflective coating facet are formed at both ends, respectively, of the RSOA; and the p-type electrode is divided into a first portion and a second portion with a predetermined gap between the two portions.

5. The PON of claim 4, wherein the active region has a multiple quantum well structure or a bulk structure.

6. The PON of claim 4, wherein the RSOA further comprises a spot-size converter which is a passive type coupled with the active region through butt-joint or an active type formed using the same material as the active region, and the spot-size converter has a far-field angle of 25 degrees or less in a vertical direction and a horizontal direction.

7. The PON of claim 4, wherein the RSOA is installed in a planar lightwave circuit (PLC) platform using a flip-chip method or is optically connected to an optical fiber through active alignment to be installed in a TO-CAN.

8. The PON of claim 4, wherein the RSOA is installed in a planar lightwave circuit (PLC) platform using a flip-chip method, and the PLC platform comprises a directional coupler.

9. The PON of claim 8, wherein the directional coupler is a 2×2 directional coupler formed by coupling two signal transmission waveguides with each other, both ends of one of the two signal transmission waveguides are optically and respectively connected to a data photodiode and a monitoring photodiode, and both ends of the other of the two signal transmission waveguide are optically and respectively connected to the RSOA and an input optical fiber, whereby the RSOA has a bidirectional module structure.

10. The PON of claim 9, wherein the PLC platform further comprises a polarization directional coupler formed by coupling the signal transmission waveguide with at least one polarization waveguide, positioned between the 2×2 directional coupler and the RSOA.

11. A passive optical network (PON) using a reflective semiconductor optical amplifier (RSOA), the PON comprising:
a central office comprising a plurality of first optic sources transmitting a downstream signal and a plurality of first receivers receiving an upstream signal;
at least one optical network terminal (ONT) comprising a second receiver receiving the downstream signal and an RSOA which receives the downstream signal, remodulates the downstream signal into the upstream signal, and
transmits the upstream signal in loopback mode; and
a remote node interfacing the central office with the ONT,
wherein the upstream signal and the downstream signal are transmitted between the remote node and the ONT via a single optical fiber, and
wherein the RSOA comprises:
an active region performing amplification;
a p-type electrode supplying current to the active region;
an anti-reflective coating facet through which a signal is input and output; and
a high-reflective coating facet reflecting a signal,
wherein the anti-reflective coating facet and the high-reflective coating facet are formed at both ends, respectively, of the RSOA; and
the p-type electrode is divided into a first portion and a second portion with a predetermined gap between the two portions.

12. The PON of claim 11, wherein the remote node comprises:
an optical multiplexer/demultiplexer; and
an optical power splitter installed at a port of the optical multiplexer/demultiplexer to be connected to the ONT.

13. The PON of claim 12, wherein the RSOA comprises:
an active region performing amplification;
a p-type electrode supplying current to the active region;
an anti-reflective coating facet through which a signal is input and output; and
a high-reflective coating facet reflecting a signal,
wherein the anti-reflective coating facet and the high-reflective coating facet are formed at both ends, respectively, of the RSOA; and the p-type electrode is divided into a first portion and a second portion with a predetermined gap between the two portions.

14. The PON of claim 13, wherein the active region has a multiple quantum well structure or a bulk structure.

15. The PON of claim 13, wherein the RSOA further comprises a spot-size converter which is a passive type coupled with the active region through butt-joint or an active type formed using the same material as the active region, and the spot-size converter has a far-field angle of 25 degrees or less in a vertical direction and a horizontal direction.

16. The PON of claim 13, wherein the RSOA is installed in a planar lightwave circuit (PLC) platform using a flip-chip method or is optically connected to an optical fiber through active alignment to be installed in a TO-CAN.

17. The PON of claim 13, wherein the RSOA is installed in a planar lightwave circuit (PLC) platform using a flip-chip method, and the PLC platform comprises a directional coupler.

18. The PON of claim 17, wherein the directional coupler is a 2×2 directional coupler formed by coupling two signal transmission waveguides with each other, both ends of one of the two signal transmission waveguides are optically and respectively connected to a data photodiode and a monitoring photodiode, and both ends of the other of the two signal transmission waveguide are optically and respectively connected to the RSOA and an input optical fiber, whereby the RSOA has a bidirectional module structure.

19. The PON of claim 18, wherein the PLC platform further comprises a polarization directional coupler formed by coupling the signal transmission waveguide with at least one polarization waveguide, positioned between the 2×2 directional coupler and the RSOA.

* * * * *